(12) United States Patent
Aga et al.

(10) Patent No.: US 7,902,042 B2
(45) Date of Patent: Mar. 8, 2011

(54) METHOD OF MANUFACTURING SOI WAFER AND THUS-MANUFACTURED SOI WAFER

(75) Inventors: Hiroji Aga, Annaka (JP); Norihiro Kobayashi, Annaka (JP); Masayuki Imai, Annaka (JP); Tatsuo Enomoto, Annaka (JP); Hiroshi Takeno, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 101 days.

(21) Appl. No.: 11/662,285

(22) PCT Filed: Sep. 9, 2005

(86) PCT No.: PCT/JP2005/016582
§ 371 (c)(1),
(2), (4) Date: Mar. 9, 2007

(87) PCT Pub. No.: WO2006/030699
PCT Pub. Date: Mar. 23, 2006

(65) Prior Publication Data
US 2008/0128851 A1    Jun. 5, 2008

(30) Foreign Application Priority Data

Sep. 13, 2004  (JP) ................. 2004-265901
Sep. 15, 2004  (JP) ................. 2004-268901

(51) Int. Cl.
*H01L 21/30* (2006.01)
*H01L 21/46* (2006.01)

(52) U.S. Cl. ..... 438/458; 438/455; 257/347; 257/E21.32

(58) Field of Classification Search .............. 257/347; 438/458, 455, 459, 928
See application file for complete search history.

(56) References Cited

U.S. PATENT DOCUMENTS 5,502,331 A * 3/1996 Inoue et al. ............ 257/617
(Continued)

FOREIGN PATENT DOCUMENTS
JP    A-5-235007    9/1993
(Continued)

OTHER PUBLICATIONS

Sep. 9, 2010 European Search Report issued in Application No. 05778598.2.
(Continued)

*Primary Examiner* — Lynne A Gurley
*Assistant Examiner* — Jesse Y Miyoshi
(74) *Attorney, Agent, or Firm* — Oliff & Berridge, PLC

(57) ABSTRACT

A method of manufacturing an SOI wafer includes a bonding step, a thinning and a bonding annealing step. Assuming refractive index n1 of $SiO_2$ as 1.5, refractive index n2 of Si as 3.5, and optical thickness $t_{OP}$ of the silicon oxide film 2 and the SOI layer 15 in the infrared wavelength region as $t_{OP}=n1 \times t1+n2 \times t2$, the thickness t1 of the silicon oxide film 2 and thickness t2 of the SOI layer so as to satisfy a relation of $0.1\lambda < t_{OP} < 2\lambda$, and so as to make $(t1 \times n1)/(t2 \times n2)$ fall within 0.2 to 3. By nuclei killer annealing carried out before the bonding annealing, density of formation of oxygen precipitate in the base wafer after the bonding annealing is adjusted to less than $1 \times 10^9/cm^3$. This configuration successfully provides a method of manufacturing the SOI wafer having the thin silicon oxide film and the SOI layer, and being less likely to cause warping.

15 Claims, 14 Drawing Sheets

U.S. PATENT DOCUMENTS

| | | |
|---|---|---|
| 5,921,773 A | 7/1999 | Lee |
| 5,972,803 A * | 10/1999 | Shu et al. .................. 438/781 |
| 6,140,210 A * | 10/2000 | Aga et al. .................. 438/458 |
| 6,303,468 B1 | 10/2001 | Aspar et al. |
| 6,414,373 B2 | 7/2002 | Yamada et al. |
| 6,485,807 B1 * | 11/2002 | Park .......................... 428/64.1 |
| 6,492,682 B1 * | 12/2002 | Akiyama et al. .............. 257/347 |
| 6,544,656 B1 | 4/2003 | Abe et al. |
| 6,808,781 B2 * | 10/2004 | Mule'Stagno et al. ...... 428/64.1 |
| 7,029,993 B1 | 4/2006 | Barge et al. |
| 7,288,418 B2 | 10/2007 | Barge et al. |
| 2001/0055859 A1 | 12/2001 | Yamada et al. |
| 2004/0063298 A1 | 4/2004 | Aga et al. |
| 2006/0189102 A1 | 8/2006 | Barge et al. |

FOREIGN PATENT DOCUMENTS

| | | |
|---|---|---|
| JP | 6-295912 | 10/1994 |
| JP | A-8-250505 | 9/1996 |
| JP | 9-64319 | 3/1997 |
| JP | 2002-9081 | 1/2002 |
| JP | A-2003-509838 | 3/2003 |
| WO | WO 00/55397 | 9/2000 |
| WO | WO 03/079447 A1 | 9/2003 |

OTHER PUBLICATIONS

Shimizu et al., "Warpage of Czochralski-Grown Silicon Wafers as Affected by Oxygen Precipitation," Japanese Journal of Applied Physics, vol. 24, No. 7, Jul. 1985, pp. 815-821.

* cited by examiner

FIG.6
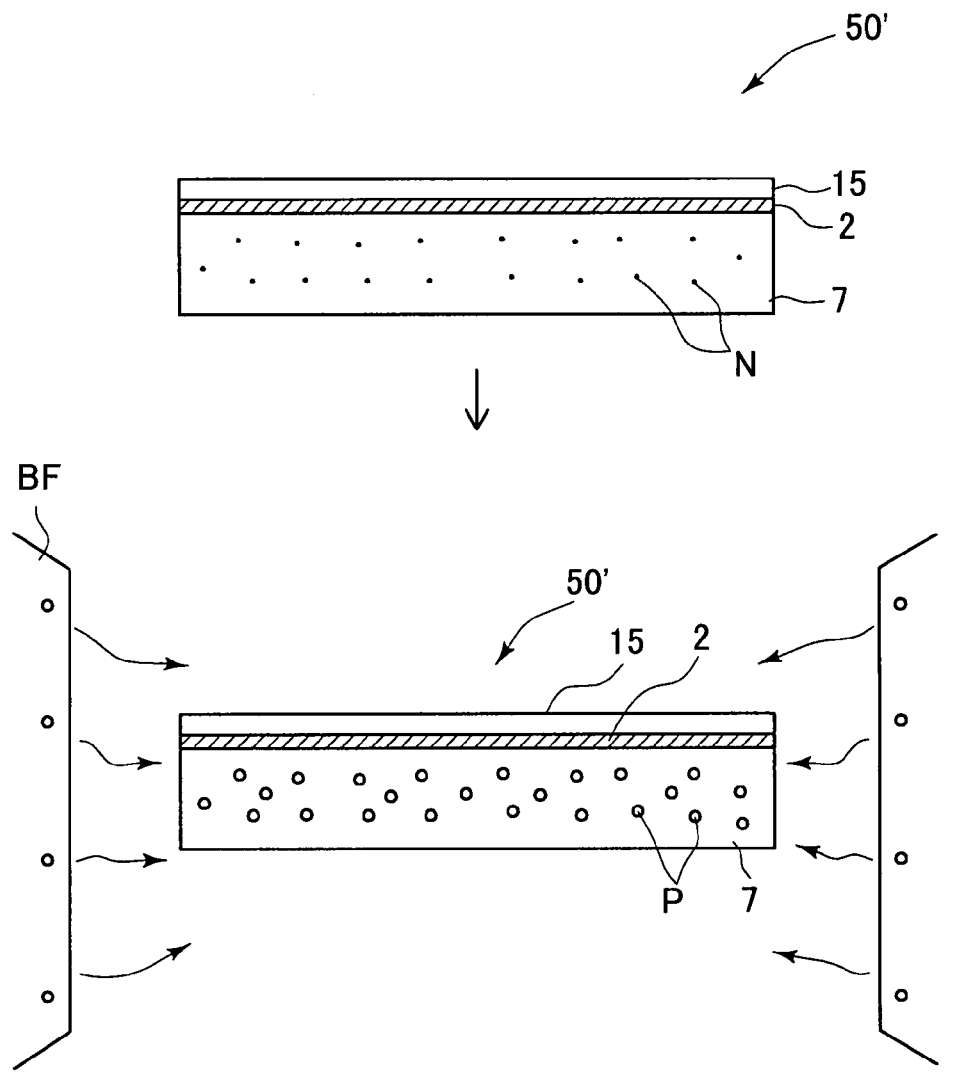
BONDING ANNEALING
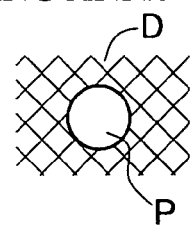

$n_1 t_1 + n_2 t_2 \simeq \lambda$ $T_S$: TARGET ANNEALING TEMPERATURE

FIG.14
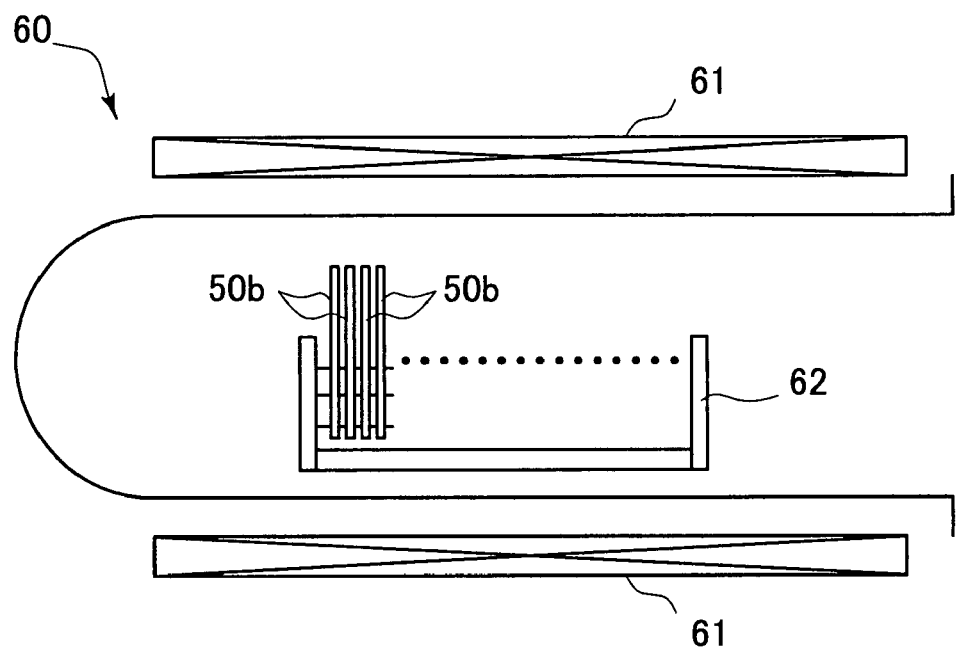
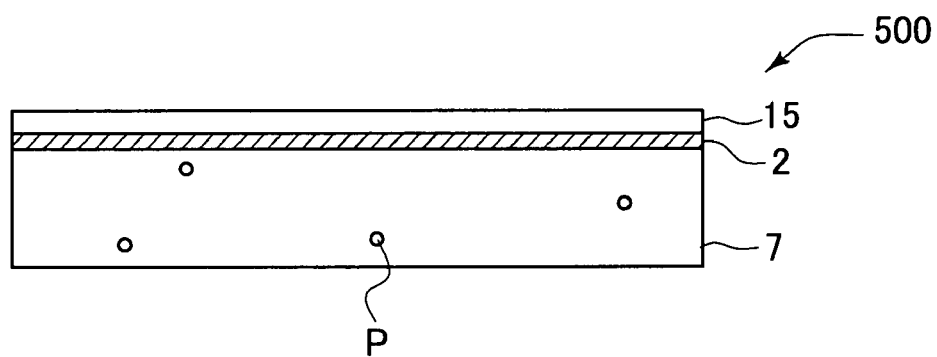

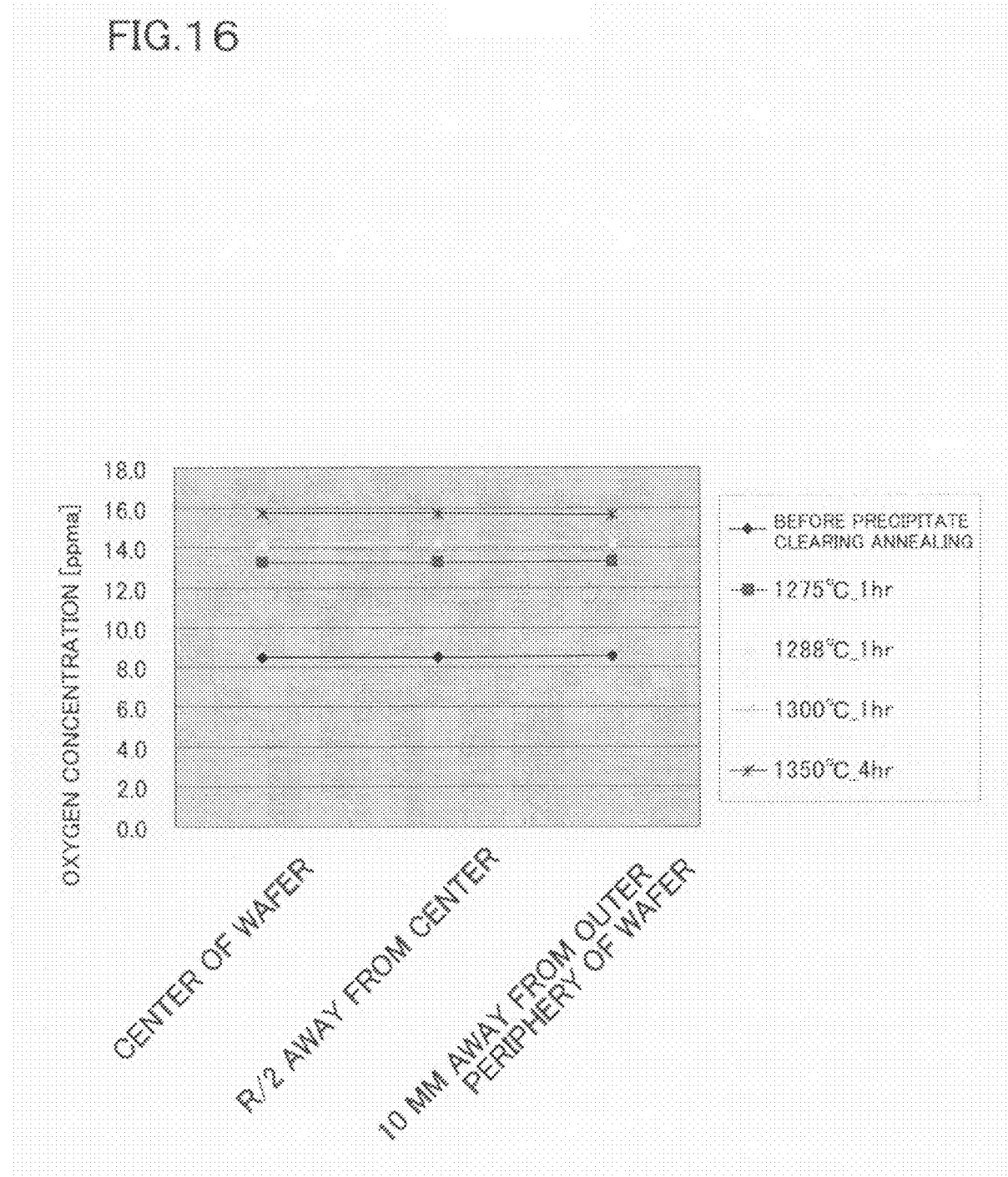

METHOD OF MANUFACTURING SOI WAFER AND THUS-MANUFACTURED SOI WAFER

RELATED APPLICATIONS

This application claims the priorities of Japanese Patent Application No. 2004-265901 filed on Sep. 13, 2004 and No. 2004-268901 filed on Sep. 15, 2004, which are incorporated herein by reference.

BACKGROUND OF THE INVENTION

1. Field of the Invention

This invention relates to a method of manufacturing an SOI wafer, and thus-manufactured SOI wafer.

2. Description of the Related Art

Patent Document 1: Japanese Laid-Open Patent Publication No. H9-64319

So-called SOI wafers, obtained by forming a silicon oxide film on a silicon single crystal substrate (also referred to as "base wafer", hereinafter), and by forming another silicon single crystal layer as being stacked thereon as an SOI (silicon on insulator) layer, are used for manufacturing semiconductor devices such as CMOS-IC and high-withstand-voltage-type IC. Bonding process, the SIMOX process and so forth are known as methods for manufacturing the SOI wafers. The bonding method is such as bonding a base wafer and a bond wafer composed of silicon single crystal while placing a silicon oxide film in between, and then thinning the bond wafer by polishing, etching, or delamination with the aid of an ion implanted layer (so-called, Smart-Cut Process (registered trademark)) so as to leave it as an SOI layer. On the other hand, the SIMOX process is such as implanting a high dose of oxygen ion into a silicon single crystal substrate, and then carrying out internal oxidation annealing to thereby form a buried oxide film.

Conventional SOI wafers have suffered from a drawback in that they are likely to cause warping of the substrate, due to difference in thermal expansion coefficients between the base wafer and the SOI layer composed of silicon single crystal, and the silicon oxide layer. If the warping of the SOI wafer increases, focusing in photolithographic process may become difficult, and device formation consequently becomes difficult. The drawback will be more distinct as the degree of integration of integrated circuits increases.

Various measures have conventionally been proposed for the above-described warping of the SOI wafers, while paying attention mainly to warping that possibly occurs in the bonding annealing in the above-described bonding process, or in the internal oxidation annealing of the SIMOX process. For example, Patent Document 1 discloses a structure of an SOI wafer, having a defect-free layer with zero density of formation of oxygen precipitate, formed in the base wafer in a region thereof in contact with the silicon oxide film, whereas the residual region of the wafer remains as an oxygen precipitate layer having a density of oxygen precipitate larger than in the defect-free layer, stating that the warping of the wafer ascribable to the above-described difference in the thermal expansion coefficients is avoidable.

SUMMARY OF THE INVENTION

The inventors of this invention, however, found out through our investigations that the warping of the SOI wafer are not always ascribable only to the difference in the thermal expansion coefficients between the silicon oxide film and silicon composing the base wafer and the SOI layer. For example, the inventors of this invention have often encountered phenomena not understandable by the above-described warping generation mechanism, such that warping of the SOI wafer, not so distinctive before being subjected to device-making processes, becomes distinctive in annealing in the device-making processes. This phenomenon is often observed when the SOI layer and the silicon oxide film are thinned (respectively 2 μm or less, for example), and is rather less likely to cause warping ascribable to difference in the thermal expansion coefficients, and becomes particularly distinctive on the wafers having large diameters (200 mm or above, for example).

It is therefore a subject of this invention to provide a method of manufacturing an SOI wafer having a relatively thin silicon oxide film and an SOI layer, and less causative of warping during annealing carried out in device-making processes, and thus-manufactured SOI wafer.

Aimed at solving the above-described subjects, a method of manufacturing an SOI wafer of this invention configured as having a base wafer composed of silicon single crystal, and an SOI layer composed of a semiconductor single crystal, bonded on a first main surface of the base wafer while placing a silicon oxide film in between, destined for annealing by infrared irradiation with a peak wavelength λ of 0.7 μm to 2 μm, both ends inclusive, on the SOI layer side thereof, the method comprising: a bonding step of bonding the first main surface of the base wafer composed of a silicon single crystal and a first main surface of a bond wafer composed of a semiconductor single crystal, while placing a silicon oxide film formed on at least either one of these main surfaces in between; a thinning step of thinning the bond wafer so as to leave it as the SOI layer; and a bonding annealing step of enhancing bonding of the SOI layer to the base wafer while placing the silicon oxide film in between, wherein, assuming refractive index of $SiO_2$ composing the silicon oxide film in the infrared wavelength region as n1, refractive index of a semiconductor composing the SOI layer as n2, and optical thickness $t_{OP}$ of the silicon oxide film and the SOI layer in the infrared wavelength region as $t_{OP}=n1 \times t1+n2 \times t2$, the thickness t1 of the silicon oxide film and thickness t2 of the SOI layer after the bonding are set so as to satisfy a relation of $0.1\lambda < t_{OP} < 2\lambda$, and so as to make $(t1 \times n1)/(t2 \times n2)$ fall within the range from 0.2 to 3, both ends inclusive, and density of formation of oxygen precipitate in the base wafer after the bonding annealing is adjusted to less than $1 \times 10^9/cm^3$. It is to be noted herein that the SOI layer in the context of this invention means not only a typical SOI layer composed of silicon single crystal, but also a SiGe layer and a Ge layer expressed as $Si_XGe_{1-X}$ ($0 \leq X \leq 1$), or an SOI (semiconductor on insulator) in a broad sense including other semiconductor thin film.

An SOI wafer of this invention is such as including a base wafer composed of silicon single crystal, and an SOI layer composed of a semiconductor single crystal, bonded on a first main surface of the base wafer while placing a silicon oxide film in between, destined for annealing by infrared irradiation with a peak wavelength λ of 0.7 μm to 2 μm, both ends inclusive, on the SOI layer side thereof, wherein, assuming refractive index of $SiO_2$ composing the silicon oxide film in the infrared wavelength region as n1, refractive index of a semiconductor composing the SOI layer as n2, and optical thickness $t_{OP}$ of the silicon oxide film and the SOI layer in the infrared wavelength region as $t_{OP}=n1 \times t1+n2 \times t2$, the thickness t1 of the silicon oxide film and thickness t2 of the SOI layer are set so as to satisfy a relation of $0.1\lambda < t_{OP} < 2\lambda$, and so as to make $(t1 \times n1)/(t2 \times n2)$ fall within the range from 0.2 to 3, both ends inclusive, and density of formation of oxygen precipitate in the base wafer is adjusted to less than $1 \times 10^9/cm^3$.

In this invention, the density of formation of oxygen precipitate in the base wafer means the number of bulk microdefects (BMD) of 50 nm or more in diameter per 1 $cm^3$, detected by an OPP (optical precipitate profiler from High Yield Technology Inc.), a publicly-known apparatus making use of the infrared interference method, wherein a second main surface of the base wafer is finished as a mirror-polished surface. In the paragraphs below, any simple expression of "oxygen precipitate" is defined to denote BMD. In the bonding, the silicon oxide film may be formed on only either one of the base wafer and the bond wafer, or may be formed on the both so as to integrate both silicon oxide films by bonding. In the latter case, thickness of the silicon oxide film after the bonding corresponds to the total thickness of the silicon oxide films formed on the both.

After thorough investigations into relations between the annealing conditions adopted when the SOI wafer is subjected to the device-making processes, and the resultant warping of the wafer, the inventors of this invention finally came to understand the facts below:

(1) Warping of the SOI wafer, which has not been distinct before being subjected to device-making processes, may sometimes become distinct in the process of annealing in the device-making processes. More specifically, it occurs when the annealing is applied by infrared irradiation from the SOI layer side.

(2) Warping becomes distinct when the wavelength of infrared radiation to be irradiated (represented by peak wavelength λ, hereinafter), and the above-described optical thickness $t_{OP}$ of the silicon oxide film and the SOI layer in the infrared wavelength region satisfy a certain relation, wherein the warping becomes particularly distinct when a relation close to $t_{OP}=0.5\lambda$ is satisfied.

(3) Any SOI wafer having the warping generated therein shows a density of formation of the oxygen precipitate in the base wafer of as high as $1 \times 10^9/cm^3$ or more.

Through further extensive investigations, the inventors of this invention found out that the warping of the SOI wafer during annealing in the device-making processes can effectively be suppressed, even under conditions of (1) and (2) described in the above, by adjusting the density of formation of oxygen precipitate over the entire portion of the base wafer to less than $1 \times 10^9/cm^3$, and finally came to complete this invention.

A cause for the fact that the warping was most likely to occur when the condition (2) described in the above was satisfied during the annealing by infrared irradiation can be considered as follows. First of all, infrared radiation sources used for the annealing are often resistance-heating-type lamps such as halogen lamps. The peak wavelengths λ thereof may vary depending on the light source temperature, but most of them fall in the range from 0.7 µm to 2 µm, both ends inclusive, as shown in FIG. 12. Major spectral components in the infrared region contributive to the heating fall in the range from 0.5 µm to 3 µm, both ends inclusive, although the optical spectra thereof are generally broad.

When considered in relation to the above-described peak wavelength λ, a situation that the optical thickness $t_{OP}=n1 \times t1+n2 \times t2$ of the silicon oxide film and the SOI layer in the infrared wavelength region satisfies $0.1\lambda < t_{OP} < 2\lambda$, and that $(t1 \times n1)/(t2 \times n2)$ falls in the range from 0.2 to 3, both ends inclusive, means that both of the silicon oxide film and the SOI layer are formed as having a small thickness of less than 4 µm (preferably the thickness t1 of the silicon oxide film is 10 nm to 500 nm, both ends inclusive, and the thickness t2 of the SOI layer is 10 nm to 500 nm, both ends inclusive). Assuming that the thickness of the base wafer is equivalent to that of general mirror-polished wafers (for example, 600 µm to 800 µm, both ends inclusive, for wafers of 200 mm in diameter), the silicon oxide film with this level of thickness supposedly causes warping, ascribable to difference in linear expansion coefficient from that of Si, only to a level far smaller than that caused by the configuration described typically in Patent Document 1. However, for the case where the base wafer has a density of formation of oxygen precipitate of as high as $1 \times 10^9/cm^3$ or above, annealing by infrared irradiation from the SOI layer side results in warping to a considerable degree beyond expectations, typically causing large warping of 200 µm to 300 µm for SOI wafers of 200 mm in diameter, for example. It is therefore obvious that the major cause for the warping is not ascribable to the difference in the linear expansion coefficients between the layers as has previously been assumed. The inventors of this invention consider that the cause for the warping could reside in degraded strength of the base wafer due to formation of the oxygen precipitate, and non-uniformity in the heating due to reflection of infrared radiation on the SOI layer side. Details will be given below.

The reflection of infrared radiation on the surface of the SOI layer possibly relates to total reflection ascribable to difference in refractive indices between the ambient atmosphere (air, for example) and the SOI layer, wherein the total reflection occurs only when the angle of incidence of infrared radiation exceeds a certain critical angle, and will raise no serious problem so far as infrared radiation can be irradiated uniformly over the entire surface of the wafer using a light source having a large in-plane width. However, combination of the silicon oxide film and the SOI layer largely differing in the refractive indices thereof may result in extremely strong reflection even if the direction of incidence of infrared radiation is close to the direction of the normal line on the plane, depending on relations between the thickness of the layers and wavelength of incident infrared radiation.

It has typically been known that a stack having the refractive index periodically varying therein, such as a stack structure of silicon oxide films and silicon layers alternatively stacked therein, consequently allows formation of a band structure, similar to electron energy in crystal, in the thickness-wise direction with respect to photo-quantized electromagnetic energy so as to prevent an electromagnetic wave having a specific wavelength corresponded to the periodicity of changes in the refractive index from entering the stacked structure. This structure is referred to as a photonic band structure, and also referred to as a one-dimensional photonic band gap structure in a narrow sense, because such structure having a multi-layered configuration causes changes in the refractive index only in the thickness-wise direction.

The photonic band gap structure tends to widen the wavelength range refused the incidence (that is, a wavelength range causing increase in the reflectivity: referred to as a photonic band gap region, hereinafter) as the number of periodicity of stacking increases, wherein even only a single periodicity of stacking simply narrows the photonic band gap region in a relative manner, still causing an extremely large reflection at around the center wavelength of the gap.

A typical SOI wafer structure, that is, having the silicon oxide film and the SOI layer formed one by one on the base wafer comes under this, wherein a condition necessary for generating the one-dimensional photonic band gap structure is such that the optical thickness $t_{OP}=n1 \times t1+n2 \times t2$ of the silicon oxide film and the SOI layer in the infrared wavelength region equals to half of the wavelength λ of the incident infrared radiation (that is $0.5\lambda$). In practice, the reflectivity still keeps a large value in the wavelength region slightly shifted from $t_{OP}=0.5\lambda$, although the reflectivity reaches a local maximum thereabout, and the peak wavelength of the incident infrared radiation, even noted as λ, practically has a wavelength distribution over a wide range including λ as shown in FIG. 12, so that considering these effects, a wavelength region causing a relatively strong reflection can be expanded to $0.1\lambda < t_{OP} < 2\lambda$ or around. A relatively strong reflection tends to occur when the ratio of optical thickness of both layers of (t1×n1)/(t2×n2) falls within the range from 0.2 to 3, both ends inclusive, and in particular, the ratio of 1 or around (in other words, both layers have the same optical thickness) widens most the wavelength range ensuring strong reflection, and consequently raises the reflectivity. The refractive index n1 of the silicon oxide film in the infrared wavelength region is 1.5, and the refractive index n2 of the SOI layer is 3.5 for silicon single crystal, 4.0 for Ge (germanium), and a value obtained by linear interpolation for $Si_xGe_{1-x}$ depending on the value of alloy composition x, assuming the value for Si as 3.5 and Ge as 4.0.

FIG. 13 shows relations between wavelength of incident beam and reflectivity, in combinations of the SOI layer and the silicon oxide film having various thickness values, together with the total optical thickness values $t_{OP}$ of the individual layers, and center wavelength values $\lambda_{PBG} (\equiv 2t_{OP})$ of the correspondent photonic band gaps (under an angle of incidence of 5°). It is obvious that the reflectivity reaches a local maximum at around $\lambda_{PBG}$ under any of these conditions, wherein the wavelength region causative of 50% or higher reflection ranges widely from around at least 700 nm up to 1.6 μm. This invention is effective for the SOI wafers showing the reflectivity to the incident wavelength maximized at around $\lambda_{PBG}$, and having 50% or higher values over a wide wavelength region (in a region ranging at least over 500 nm or wider) including $\lambda_{PBG}$. It is to be noted that the mirror-polished wafer (PW) has no local maximum in the reflectivity, showing a relatively low reflectivity over the entire wavelength range.

When the center wavelength of the photonic band gap formed by the silicon oxide film and the SOI layer is proximal to the wavelength λ of the incident infrared radiation, heat distribution in the thickness-wise direction of the wafer becomes non-uniform, as being affected by reflection, even if the infrared radiation is uniformly irradiated over the entire surface of the SOI layer (such non-uniformity does not occur always so as to lower the temperature on the SOI layer side where the reflection occurs, as it will be explained in details). If any non-uniformity in temperature occurs in the thickness-wise direction in the base wafer, also the in-plane thermal stress of the base wafer causes distribution in the thickness-wise direction thereof, and acts as a stress for generating warping. On the other hand, in the base wafer having the oxygen precipitate formed therein, the silicon single crystal bulk region composing the wafer around the oxygen precipitate has a large number of crystal defects such as dislocation introduced therein, and is consequently in a state lowered in the strength. It is therefore supposed that the base wafer having a high density of oxygen precipitate formed therein becomes no more durable, by its rigidity, against the warping stress in the thickness-wise direction ascribable to the non-uniformity in the heating described in the above, and thereby a distinct warping occurs. The SOI wafer can, however, be effectively prevented from causing a strong warping after the heating, even when the non-uniformity in the heating occurs due to the photonic band gap effect, if the density of formation of the oxygen precipitate in the entire base wafer is suppressed to less than $1\times10^9/cm^3$. The density of formation of the oxygen precipitate in the base wafer is preferably less than $5\times10^8/cm^3$, and more preferably less than $5\times10^7/cm^3$.

Especially, the effect of this invention is exhibited in an exceptionally distinct manner, when the annealing of the SOI wafer is carried out using a so-called, single-side-heating-type annealing apparatus equipped with an infrared radiation source disposed only on the $t_{OP}$ surface side of the SOI layer. In this type of annealing apparatus, the SOI wafer is heated normally by controlling heating output of the infrared radiation source, while measuring temperature of the base wafer using a temperature sensor (radiation thermometer, for example) disposed on a second main surface side of the base wafer, so that the base wafer to be measured is heated to and kept at a target annealing temperature. In this case, the situation described below will arise if the SOI layer forms the photonic band gap structure together with the silicon oxide film.

In the initial stage, temperature of the base wafer detected by the temperature sensor is lower than the target temperature, so that temperature elevation starts while being controlled so as to increase the power of the infrared radiation source. However, a large portion of infrared radiation is reflected on the SOI layer side, causing only a slow elevation of temperature detected on the second main surface side of the base wafer. As a consequence, the control section of the light source tries to increase the infrared radiation power more and more, aiming at elevating the detected temperature close to the target value. In other words, the power of the infrared radiation source is controlled as being shifted towards the excessive side, as compared with the case where only a less degree of reflection occurs thereon (typically for the case where the mirror-polished wafer having no SOI layer formed thereon is annealed). On the other hand, not only radiative heat conduction based on direct incidence of infrared radiation, but also heat conduction from the ambient atmosphere, of course, are contributive to the heat conduction from the surface of the SOI layer to the base wafer side. If the power of the infrared radiation source is shifted to the excessive side, temperature of the ambient atmosphere not susceptible to the reflection extraordinarily elevates, the temperature of the SOI layer side in contact therewith becomes excessively high, and difference in the temperature between the first main surface and the second main surface of the base wafer becomes extremely large. The SOI wafer therefore becomes more susceptible to warping. However, by controlling the density of formation of the oxygen precipitate over the entire portion of the base wafer as in this invention to less than $1\times10^9/cm^3$, the warping of the SOI wafer can be suppressed to a sufficient level, even when the SOI wafer is annealed by adopting this sort of heating system.

The effect becomes particularly distinct when the target temperature for the annealing in the device-making processes is typically as high as 1,000° C. to 1,200° C., both ends inclusive, and the temperature elevation rate up to the target temperature is typically as large as 50° C./sec to 100° C./sec, both ends inclusive. That is, when the temperature elevation rate is set large, the power of the infrared radiation source is enhanced before heat conduction in the thickness-wise direction of the wafer fully proceeds, so that temperature elevation on the second main surface of the base wafer to be measured will be delayed more and more comparing with the temperature on the SOI layer side. As a consequence, the power of the infrared radiation source becomes more likely to cause over-shooting, and also to cause warping.

The oxygen precipitate in the base wafer is likely to generate particularly when the base wafer is composed of a silicon single crystal having a relatively high oxygen content rate, and more specifically, likely to generate a large amount of oxygen precipitate causative of warping, due to various thermal history applied in the process of manufacturing of the SOI wafer, when the wafer is manufactured by the Czochralski method using a quartz crucible. It is therefore preferable to appropriately carry out annealing for reducing the oxygen precipitate in the process of manufacturing the SOI wafer, in view of reducing the density of formation of the oxygen precipitate in the resultant SOI wafer.

A silicon single crystal wafer having a relatively high oxygen concentration (bulk silicon single crystal typically having an oxygen concentration of 12 ppma to 25 ppma, both ends inclusive), such as CZ wafer, is known to generate precipitation nuclei (embryo: having a size of generally 1 nm or smaller) of oxygen precipitate (BMD), when the wafer goes through a temperature region at around 500° C., more specifically a temperature region having a center temperature of formation of 480° C., which is slightly higher than 450° C. where thermal donors are formed, during cooling after pulling-up of the crystal, or during cooling after solubilizing oxygen into solid by high temperature annealing at 1,000° C. or above. The density of the precipitation nuclei to be formed will be raised as the hold time at around the above-described center temperature of formation becomes longer. The precipitation nuclei grow up to BMD, when the wafer is kept at temperatures not lower than the nuclei generation temperature and not higher than a certain critical temperature relevant to re-solid-solubilization into the Si single crystal bulk. What should be taken into account in the process of manufacturing the SOI wafer is that the bonding annealing for enhancing bonding strength between the SOI layer and the base wafer is carried out in a batch-type annealing furnace, in such a way that a plurality of SOI wafers are collectively annealed in view of raising the process efficiency, while setting the hold temperature during the annealing to 1,000° C. to 1,200° C., both ends inclusive. In the bonding annealing, the process temperature is certainly in the temperature region wherein the precipitation nuclei disappear, but only a slow temperature elevation speed up to the target process temperature of 10 to 40° C./minute can be ensured because of a nature of the batch annealing having a relatively large process capacity, allowing most of the precipitation nuclei to grow up to BMD during the temperature elevation. It is to be noted that the oxygen concentration in this patent specification is expressed in unit based on criteria of JEIDA (acronym for Japanese Electronic Industry Development Association, renamed JEITA (Japan Electronics and Information Technology Industries Association) at present).

It is now possible, prior to the bonding annealing, to carry out nuclei killer annealing for clearing the precipitation nuclei of the oxygen precipitate in the base wafer or reducing the density of the precipitation nuclei, to thereby fully reduce the number of precipitation nuclei possibly grown up to BMD during the bonding annealing, and to thereby readily suppress the density of formation of BMD in the base wafer of the resultant SOI wafer to less than $1 \times 10^9/cm^3$. The nuclei killer annealing is necessarily carried out so as to heat the wafer up to the target temperature at a temperature elevation speed larger than that in the bonding annealing. The hold temperature during the annealing is preferably set to 900° C. to 1,200° C., both ends inclusive. The temperature lower than 900° C. may make it difficult to fully re-solubilize into sold and clear the precipitation nuclei, and the annealing at a temperature exceeding 1,200° C. may make slip dislocation more likely to occur. The heating up to the hold temperature in the annealing is preferably carried out at a temperature elevation speed of 5° C./second to 100° C./second, both ends inclusive. The temperature elevation speed of less than 5° C./second may raise a fear of growing up of the precipitation nuclei to BMD, whereas the temperature elevation speed exceeding 100° C./second is less feasible for normal annealing apparatus. The nuclei killer annealing raising such needs of temperature elevation speed is preferably carried out using a single-wafer-processing type rapid thermal processing (RTP) apparatus based on infrared lamp heating. The heating is preferably carried out using infrared lamps, so as to simultaneously heat both surfaces of the SOI wafer, wherein heating of only a single surface is also allowable.

A hydrogen atmosphere, an Ar atmosphere, or a mixed atmosphere of the both, for example, is applicable to the atmosphere for the nuclei killer annealing. The hold temperature in the annealing for this case is preferably set to 900° C. to 1,100° C., both ends inclusive. This is because, when the hydrogen atmosphere or the Ar atmosphere is adopted, the annealing above 1,100° C. may promote introduction of atomic vacancy (capable of mediating diffusion in the process of oxygen precipitation) into silicon single crystal during the annealing, and may rather increase the density of formation of BMD. On the other hand, the nuclei killer annealing may be carried out also in an oxygen atmosphere. Introduction of atomic vacancy is suppressed under the oxygen atmosphere, so that a target of the hold temperature in the annealing can be set to 900° C. to 1,200° C., both ends inclusive, as being expanded larger on the high temperature side.

Next, the thinning step can be carried out, prior to the bonding step, as containing a delamination-use ion implanted layer forming step of forming a delamination-use ion implanted layer by implanting ions through the ion implantation surface on a first main surface side of the bond wafer; and a delamination step, following the bonding step, of delaminating a semiconductor single crystal thin layer destined for the SOI layer from the bond wafer at the delamination-use ion implanted layer (so-called Smart-Cut Process (registered trade name)). The nuclei killer annealing in this case preferably follows the delamination step. This is because the nuclei killer annealing carried out before the delamination step may result in fusion of the silicon single crystal thin layer destined for the SOI layer, once being delaminated at the delamination-use ion implanted layer, with the residual portion of the bond wafer, and may make re-delamination difficult.

As has been described in the above, the nuclei killer annealing carried out prior to the bonding annealing step can successfully reduce the precipitation nuclei otherwise possibly grow up to BMD. On the other hand, it is also possible to reduce the BMD per se grown up from the precipitation nuclei during the bonding annealing step by any other annealing. More specifically, as a step of adjusting the density of formation of the oxygen precipitate in the base wafer to less than $1 \times 10^9/cm^3$, a precipitate clearing annealing step of reducing the density of formation of the oxygen precipitate in the base wafer can be carried out after the bonding annealing, so as to adjust the density of formation of the oxygen precipitate in the base wafer to less than $1 \times 10^9/cm^3$.

After the bonding annealing step, by carrying out the precipitate clearing annealing at a temperature higher than in the bonding annealing, the oxygen precipitate in the base wafer is solubilized. By this process, the SOI wafer subjected to the device-making processes can be reduced in the density of formation of BMD in the base wafer to less than as $1 \times 10^9/cm^3$. Lowering in the density of formation of BMD distinctively appears also in changes in concentration of dissolved oxygen before and after the precipitate clearing annealing.

The precipitate clearing annealing is preferably carried out under a hold temperature of 1,275° C. to 1,350° C., both ends inclusive. Low hold temperature prevents solubilization of BMD from effectively proceeding. On the other hand, too high hold temperature may cause distinctive occurrence of slip dislocation. This is preferably carried out at 1,280° C. to 1,300° C., both ends inclusive. Duration of time over which the SOI wafer is held in such temperature range is preferably 1 hour to 5 hours, both ends inclusive, taking progress of solubilization of BMD and economical efficiency into consideration. The precipitate clearing annealing under these conditions is preferably carried out by using a batch-processing-type annealing furnace, so as to collectively process a plurality of SOI wafers.

An atmosphere containing an inert gas (for example, rare gas such as argon gas) and a trace amount of oxygen is adoptable as the atmosphere of the precipitate cleaning annealing. Adoption of the atmosphere containing a trace amount of oxygen can suppress introduction of atomic vacancy (capable of mediating diffusion in the process of oxygen precipitation) into silicon single crystal, and is effective in terms of reducing BMD.

As described in the above, the SOI wafers are manufactured often by using CZ wafers. A CZ silicon single crystal ingot has an initial oxygen concentration nearly uniform as a whole, but still has distributions in the axial direction and the radial direction. Generally speaking, control of BMD density is supposed to need precise examinations into the initial oxygen concentration. However, this invention scarcely needs this sort of examinations, but can stably manufacture the SOI wafers less causative of warping even after gone through RTA (rapid thermal annealing) in the device making process, not only when the SOI wafers are manufactured using CZ wafers sliced out from the same CZ silicon single crystal ingot, but also when manufactured using CZ wafers of different manufacturing lots, so far as conditions for the precipitate clearing annealing are appropriately adjusted.

BRIEF DESCRIPTION OF THE DRAWINGS

FIG. 6 is a schematic drawing explaining relations between bonding annealing and generation of oxygen precipitate;

FIG. 14 is a schematic drawing showing an effect of reducing BMD by the precipitate clearing annealing;

FIG. 16 is a graph showing results of measurement of dissolved oxygen concentration in the base wafer.

BEST MODES FOR CARRYING OUT THE INVENTION

First Mode of Embodiment

Paragraphs below will describe modes of embodiment of this invention, referring to the attached drawings.

Figure 1:
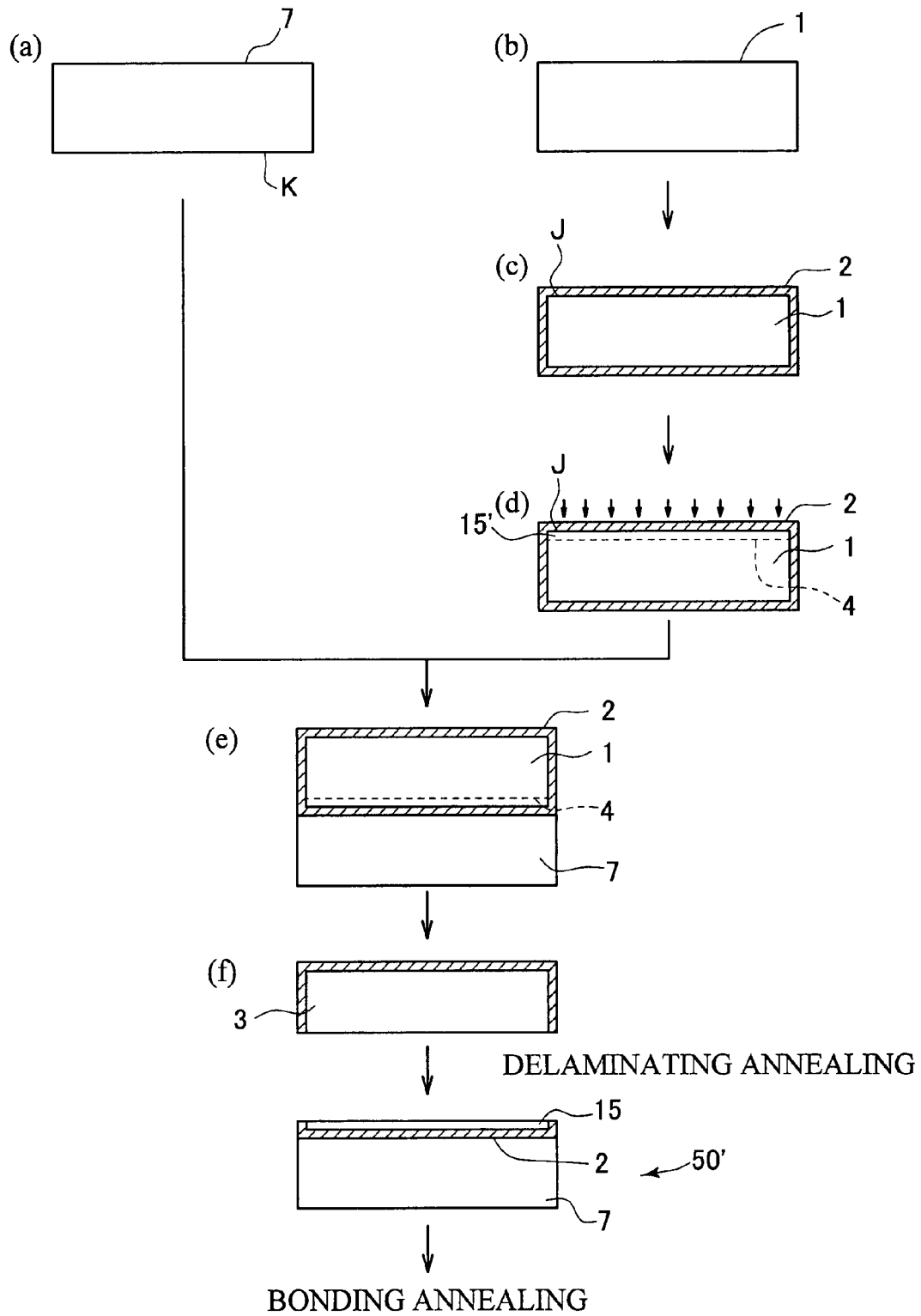
FIG. 1 is an explanatory drawing showing process steps of manufacturing an SOI wafer.

FIG. 1 is a drawing explaining a basic mode of embodiment of the method of manufacturing an SOI wafer according to this invention. First, a base wafer 7 typically composed of a silicon single crystal as shown in STEP (a), and a bond wafer 1 composed of silicon single crystal substrate as shown in STEP (b) are prepared. These silicon single crystal are manufactured by the publicly-known Czochralski method using a quartz crucible, and have an relatively high initial oxygen content of typically 12 ppma to 25 ppma, both ends inclusive. The bond wafer 1 applicable herein may also be an epitaxial wafer having a silicon single crystal wafer and a semiconductor single crystal such as Si, SiGe, Ge or the like epitaxially grown thereon.

Next, as shown in STEP (c), a silicon oxide film 2 is formed as an insulating film at least on a first main surface J side of the bond wafer 1. The silicon oxide film 2 can be formed by thermal oxidation such as wet oxidation and dry oxidation, also allowing adoption of a method such as CVD (chemical vapor deposition). Thickness of the silicon oxide film 2 is set to a value typically from 10 nm to 500 nm, both ends inclusive. Next, as shown in STEP (d), the first main surface J side of the bond wafer 1, or the surface of the silicon oxide film 2 in this mode of embodiment, assumed as the ion implantation surface, is irradiated typically with a hydrogen ion beam so as to implant the ion, and thereby a delamination-use ion implanted layer 4 is formed. The ion used for forming the delamination-use ion implanted layer 4 may be at least any one species selected from the group consisting of hydrogen ion and rare gas (He, Ne, Ar, Kr, Xe) ions. Hydrogen ion is used in this mode of embodiment, wherein the delamination-use ion implanted layer 4 may be formed also by implanting a rare gas ion such as helium ion, neon ion or argon ion, in place of using hydrogen ion.

The bond wafer 1 having the delamination-use ion implanted layer 4 formed therein and the base wafer 7 are cleaned in a cleaning solution, and both wafers 1 and 7 are then bonded on the side where the ion implanted layer 4 was formed (that is, on the first main surfaces J and K sides), as shown in STEP (e). The stack is then subjected to delaminating annealing at low temperatures from 400° C. to 600° C. as shown in STEP (f), so as to delaminate the bond wafer 1 nearly at a position of a peak concentration in the delamination-use ion implanted layer 4, wherein the portion remained on the base wafer 7 side becomes an SOI layer 15 (delamination step). The delaminating annealing may occasionally be omissible, if ion dose is raised in the process of forming the delamination-use ion implanted layer 4, or if the surface to be superposed is preliminarily activated by plasma treatment. The residual bond wafer portion 3 after the delamination may be re-polished on the delamination surface thereof, and can be recycled again as the bond wafer or the base wafer. The above temperature range for delaminating annealing overlaps the generation temperature of the precipitation nuclei of oxygen precipitate (BMD) explained previously, so that the precipitation nuclei may possibly increase during the annealing. The precipitation nuclei of BMD can, however, be reduced thereafter without problems, if followed by carrying out the nuclei killer annealing described later.

Figure 10:
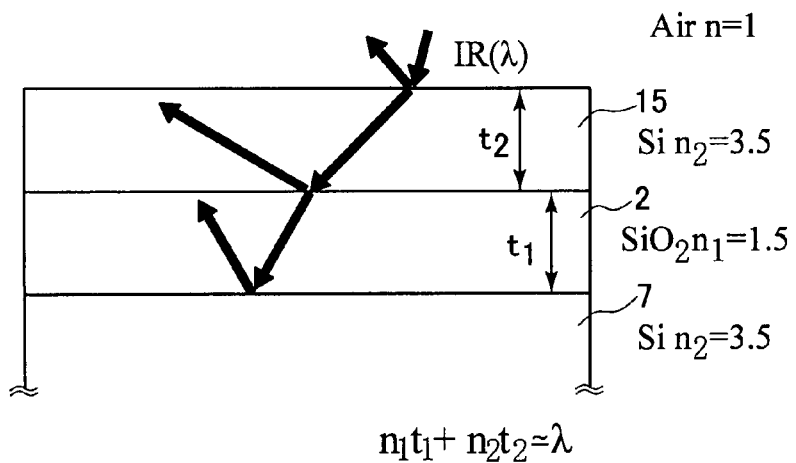
FIG. 10 is a drawing schematically showing a profile of reflection of infrared radiation on the SOI layer side caused by formation of a photonic band gap structure.

Thickness of the SOI layer 15 is 10 nm to 500 nm, both ends inclusive, and is adjustable by depth of formation of the delamination-use ion implanted layer 4. Assuming refractive index n1 of $SiO_2$ composing the silicon oxide film 2 in the infrared wavelength region as 1.5, refractive index n2 of Si composing the SOI layer 15 as 3.5, and optical thickness $t_{OP}$ of the silicon oxide film 2 and the SOI layer 15 in the infrared wavelength region as $t_{OP}=n1 \times t1+n2 \times t2$, the thickness t1 of the silicon oxide film 2 and the thickness t2 of the SOI layer 15 after the bonding are set so as to satisfy a relation of $0.1\lambda < t_{OP} < 2\lambda$, and so as to make $(t1 \times n1)/(t2 \times n2)$ fall within the range from 0.2 to 3, both ends inclusive, as shown in FIG. 10.

After the delaminating step, the bonding annealing is carried out so as to tightly bond the base wafer 7 and the SOI layer 15 while placing the silicon oxide film 2 in between. The bonding annealing is carried out at 1,000° C. to 1,250° C., both ends inclusive, in a batch-type annealing furnace BF housing therein a plurality of wafers 50' as shown in FIG. 6 (only one wafer shown in the drawing). Because the batch annealing has a relatively large processing capacity, the temperature elevation speed up to the target process temperature is as small as 10 to 40° C./minute, and thereby precipitation nuclei N in the base wafer 7 grow up to oxygen precipitates (BMD) P during the temperature elevation. The silicon single crystal bulk region composing the wafer around the oxygen precipitates P has a large number of crystal defects D such as slip dislocation, and is lowered in the strength.

Figure 3:
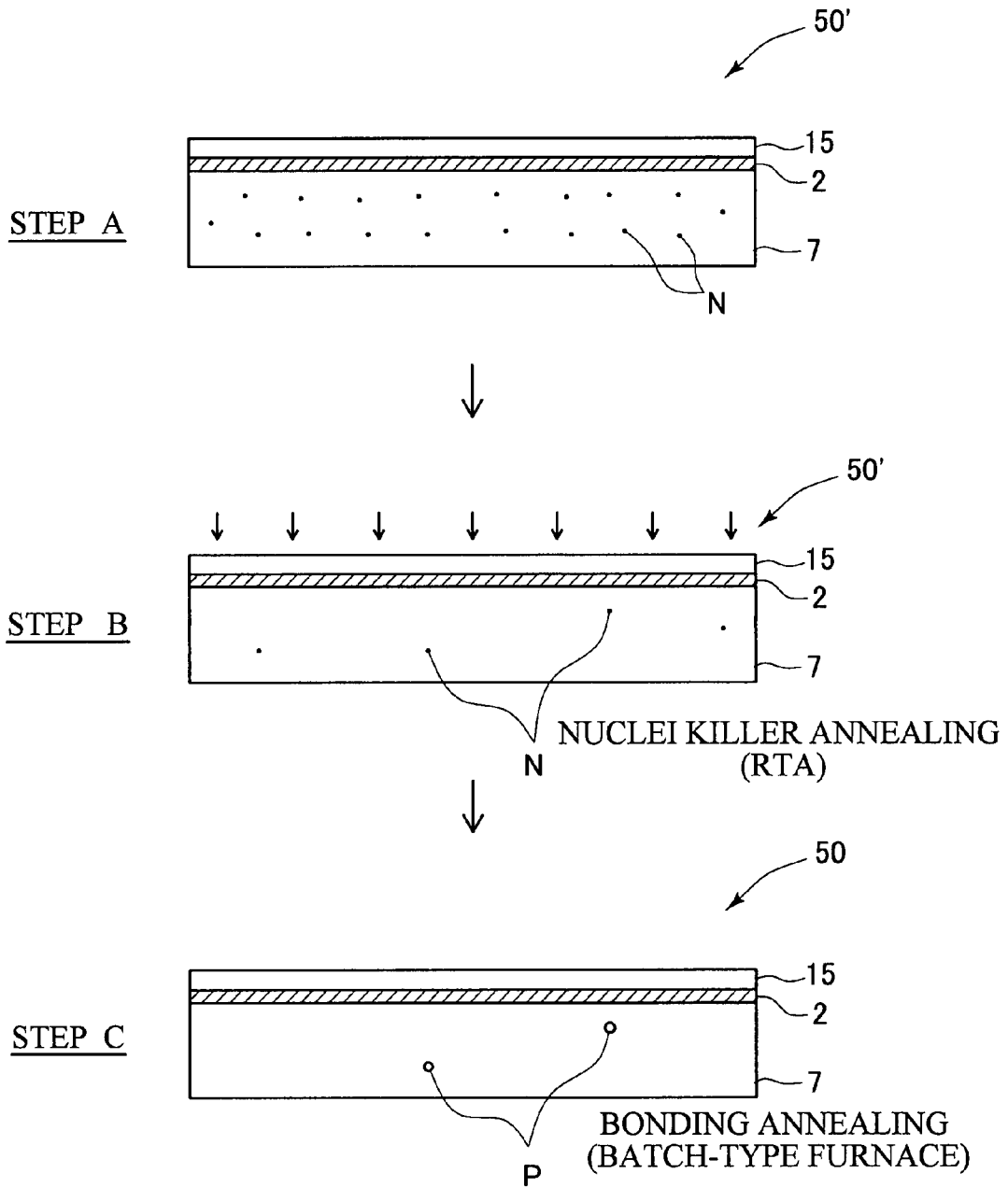
FIG. 3 is a drawing explaining effects of the nuclei killer annealing.

The nuclei killer annealing, as shown in FIG. 3, is then carried out prior to the above bonding annealing (and following the delamination step). More specifically, in the state of STEP A before the annealing, the base wafer 7 of the bonded wafer 50' has a relatively large density (for example, $1 \times 10^9/cm^3$ or above) of BMD nuclei N formed therein. Next, the nuclei killer annealing shown in STEP B is carried out, while setting the hold temperature in the annealing at 900° C. to 1,200° C., both ends inclusive (more preferably at 1,000° C. to 1,200° C., both ends inclusive), at a temperature elevation speed up to the hold temperature in the annealing of 5° C./second to 100° C./second, both ends inclusive. The annealing can be carried out using the RTP apparatus described in the above.

Figure 2:
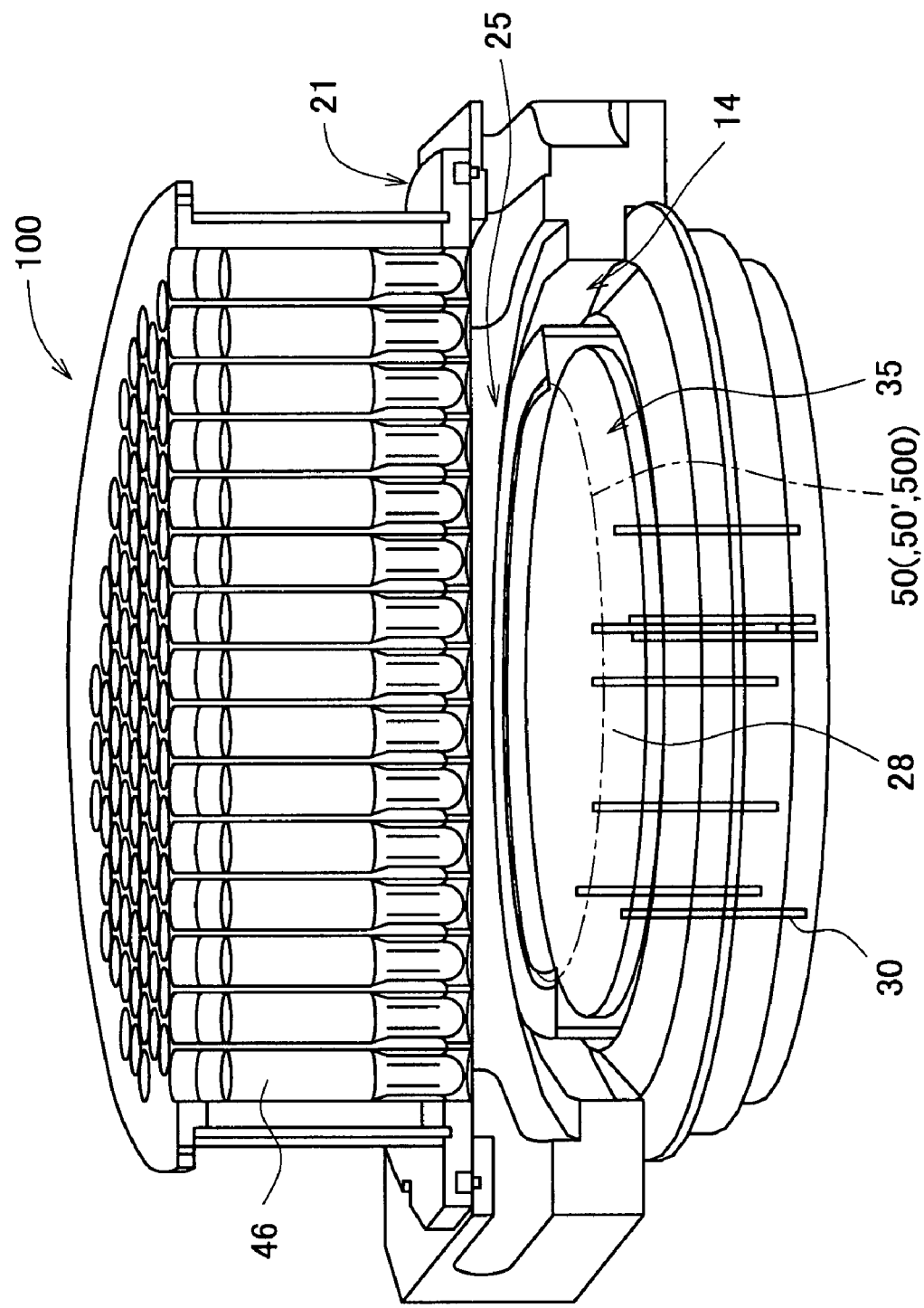
FIG. 2 is a perspective view showing an exemplary RTP apparatus.

FIG. 2 shows an exemplary single-side-heating-type RTP apparatus. The RTP apparatus 100 has a container 21 having formed therein a housing space 14 housing only a single bonded wafer 50' as an object to be processed, and heating lamps 46 typically composed of tungsten-halogen lamps for heating the bonded wafer 50' in the housing space 14. The heating lamps 46 are disposed so as to oppose with the top surface side of the bonded wafer 50', while keeping a heating gap 25 in between. On the back surface side of the bonded wafer 50', a reflective plate 28 is disposed so as to oppose with the bonded wafer 50', forming a reflection gap 35 therebetween. On the reflective plate 28, ends of glass fibers 30 (connected to radiation thermometers not shown) for measuring temperature of the back surface side of the bonded wafer 50' (that is, the second main surface side of the base wafer) are exposed. Heat ray extracted through the glass fibers 30 from the reflection gap 35 is independently detected by publicly-known radiation thermometers composing a temperature detection section, and converted into temperature signal. Of the plurality of heating lamps 46, those disposed at corresponding positions to the individual positions of temperature measurement using the glass fibers 30 are designed for output to be controllable.

By the rapid temperature elevation described in the above, as shown in STEP B in FIG. 3, the precipitation nuclei N formed in the base wafer reach a temperature where they can solubilize themselves into the silicon single crystal bulk before being grown up to the BMD, so that the density of formation of the nuclei after the annealing can be reduced to a large degree. As a consequence, even after the bonding annealing was carried out in STEP C in FIG. 3, the density of formation of the oxygen precipitates P, which becomes distinct after growth of the precipitation nuclei N, can be reduced as well to as low as $1 \times 10^9/cm^3$ or below (preferably $5 \times 10^8/cm^3$ or below), by virtue of a reduced number of precipitation nuclei N.

Figure 4:
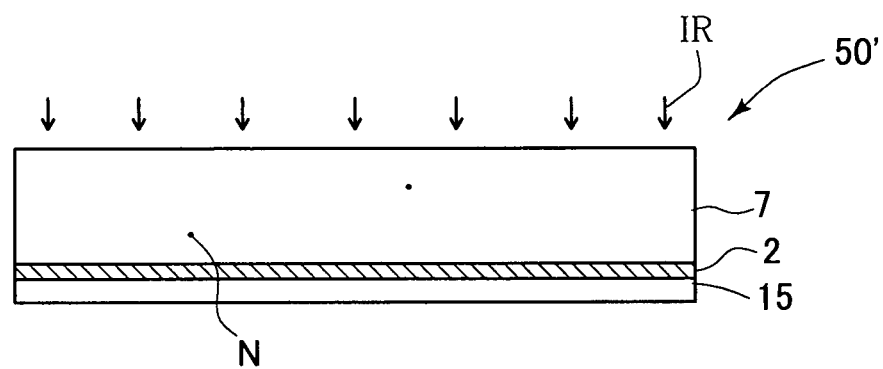
FIG. 4 is a schematic drawing showing a more preferable mode of embodiment of the nuclei killer annealing.
Figure 5:
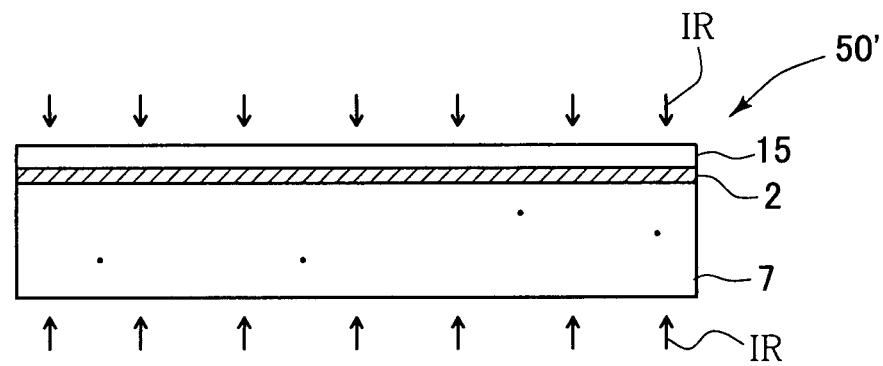
FIG. 5 is a schematic drawing showing another more preferable mode of embodiment of the nuclei killer annealing.

The nuclei killer annealing in the single-side-heating-type RTP apparatus as described in the above can be carried out by infrared irradiation on the SOI layer 15 side as shown in FIG. 3, whereas irradiation of infrared radiation IR on the second main surface (back surface) side of the base wafer 7 as shown in FIG. 4 is more preferable, in view of moderating effects of reflection on the SOI layer side. For more uniform heating, it is also preferable to heat the bonded wafer 50' by irradiating infrared radiation IR on both surfaces thereof, as shown in FIG. 5. Atmosphere of the nuclei killer annealing may be a hydrogen atmosphere, an Ar atmosphere, or a mixed atmosphere of the both (typically under a pressure of $10^3$ Pa to $10^6$ Pa, both ends inclusive). The hold temperature in the nuclei killer annealing in this case is preferably adjusted to 1,100° C. or below. On the other hand, the atmosphere of the nuclei killer annealing may also be an oxygen-containing atmosphere (typically under a pressure of 1 atm), wherein the upper limit of a preferable range of the hold temperature in this case can be expanded to 1,200° C. The oxygen-containing atmosphere may be an $O_2/N_2$ mixed atmosphere or a pure $O_2$ atmosphere, for example.

Figure 12:
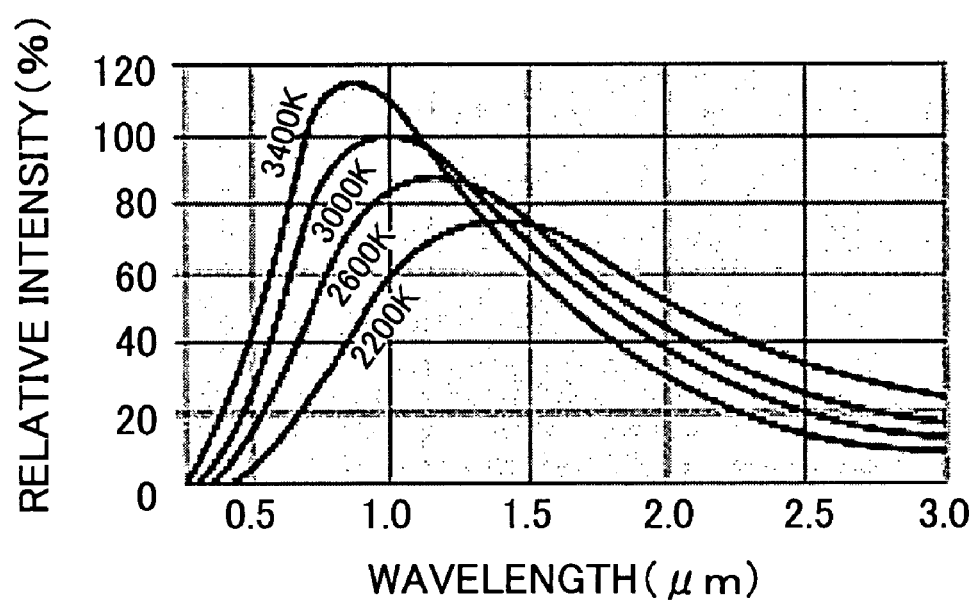
FIG. 12 is a chart showing several exemplary spectra of infrared radiation sources applicable to the RTP apparatus.
Figure 13:
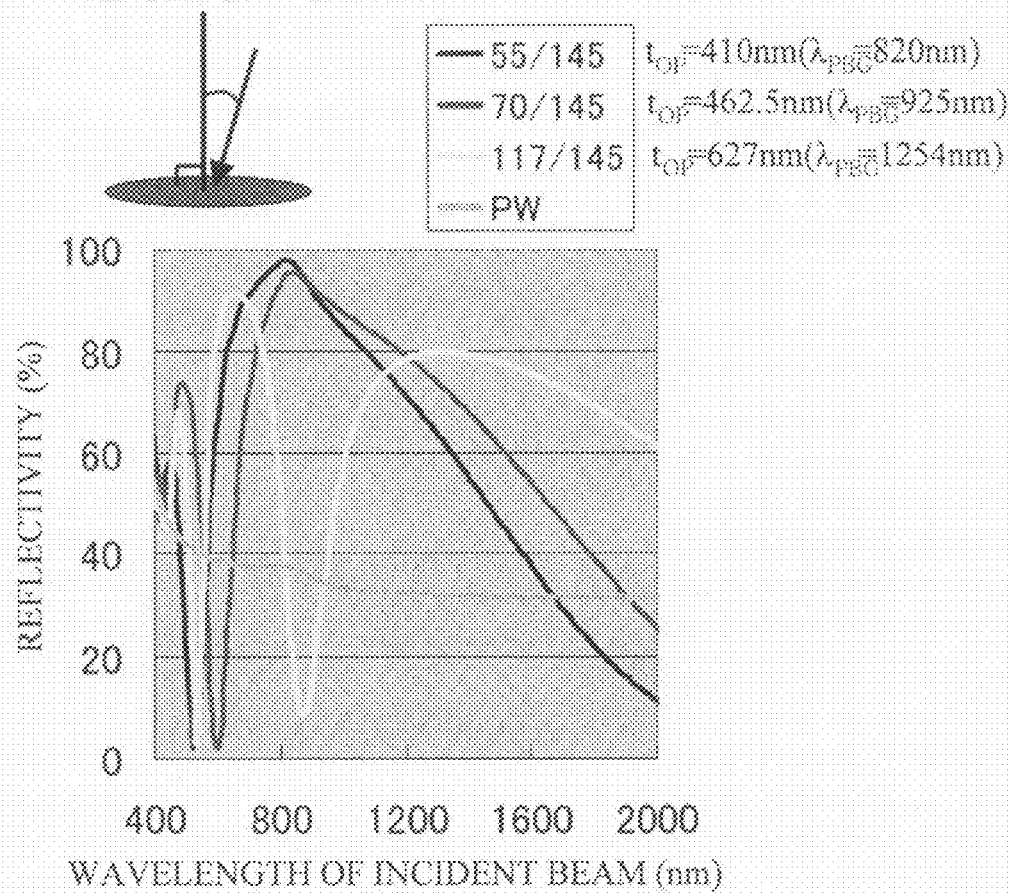
FIG. 13 is a graph showing relations between wavelength of incident infrared radiation and reflectivity in SOI layer/silicon oxide film satisfying various relations of thickness.

The SOI wafer 50 obtained by bonding annealing is subjected to various annealing in the process of device making. For an exemplary case where doped regions are formed by patterning using ion implantation, the dopant just after implanted is not activated as a carrier source, so that annealing is carried out in order to activate the dopant. For an exemplary case of B doping, temperature of the activation annealing is adjusted to 1,100° C. to 1,200° C., both ends inclusive. Also this annealing is carried out, using the RTP apparatus 100 similar to that shown in FIG. 2 (an object to be processed is the SOI wafer 50), in a rapid heating manner while adjusting the temperature elevation speed up to the annealing temperature to 50° C./second to 100° C./second (typically 75° C./second), both ends inclusive. The SOI wafer 50 is disposed at top surface side so as to oppose the SOI layer with the heating lamps 46. Infrared radiation emitted from the heating lamps 46 is near infrared radiation typically having a continuous spectrum as shown in FIG. 12 with a peak wavelength λ of 0.7 μm to 2 μm, both ends inclusive (the same infrared radiation is used for the nuclei killer annealing).

Figure 9:
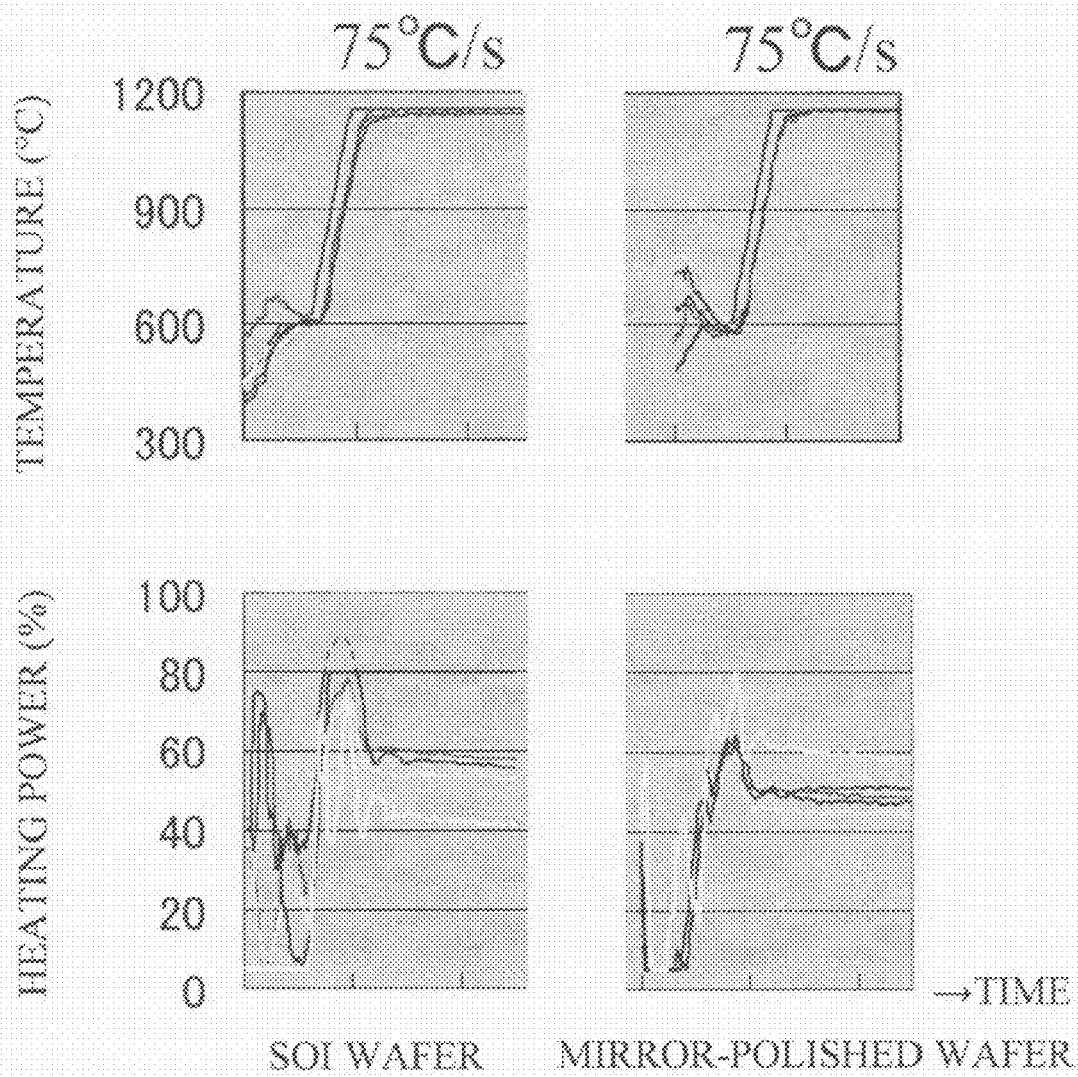
FIG. 9 are graphs showing relations between temperature elevation profiles and heating power control profiles of a single-side-heating-type RTP apparatus, compared between an SOI wafer and a mirror-polished wafer.

Graphs are given in FIG. 9 for showing exemplary temperature elevation profiles and power control profiles of heating lamps 46 (measured at a plurality of sites on the wafer plane), as being compared between the SOI wafer and a mirror-polished wafer for reference (silicon single crystal wafer). As for the mirror-polished wafer, the power control profile necessary for realizing a temperature elevation profile of 75° C./second is found to reside in approximately 70% or below of the full power, except for instantaneous values, showing no sign of excessive temperature elevation of the heating lamps 46. However as for the SOI wafer, a distinct overshooting as much as exceeding 80% of the full power occurs in the process of temperature elevation. A reason for this phenomenon is supposed as follows.

Figure 11:
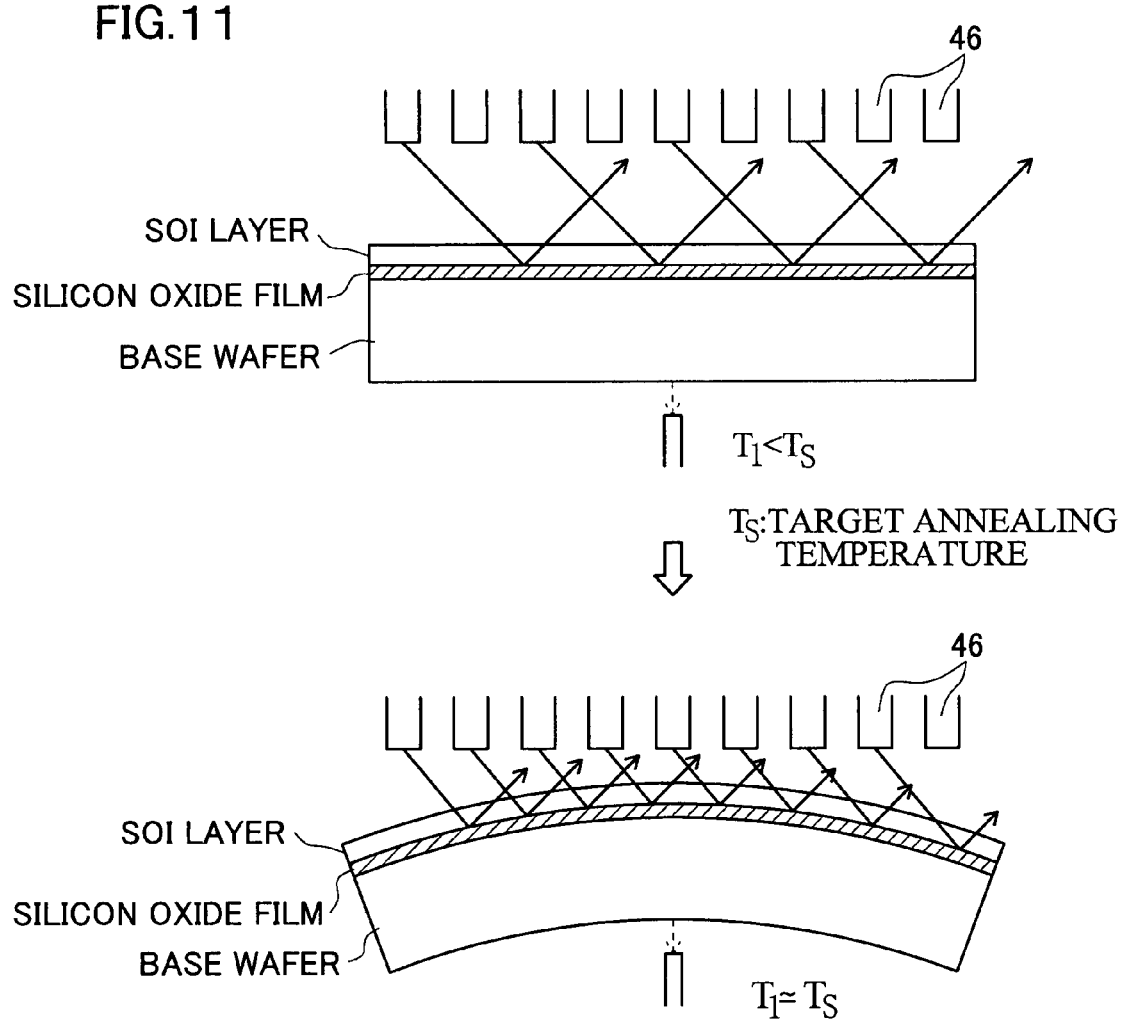
FIG. 11 is a schematic drawing explaining a mechanism of generation of warping in an SOI wafer in the single-side-heating-type RTP apparatus.

When the thickness t1 of the silicon oxide film 2 and thickness t2 of the SOI layer 15, in a structure having the single silicon oxide film 2 and the single SOI layer 15 formed on the base wafer 7, are selected so as to satisfy a relation of $0.1\lambda < t_{OP} < 2\lambda$ with peak wavelength of the infrared radiation as $\lambda$ (referred to FIG. 12), and so as to make (t1×n1)/(t2×n2) fall within the range from 0.2 to 3, both ends inclusive, assuming refractive index n1 of $SiO_2$ composing the silicon oxide film 2 in the infrared wavelength region as 1.5, refractive index n2 of Si composing the SOI layer 15 as 3.5, and optical thickness $t_{OP}$ of the silicon oxide film 2 and the SOI layer 15 in the infrared wavelength region as $t_{OP}$=n1×t1+n2×t2 as described in the above, a strong reflection of infrared radiation IR occurs on the SOI layer 15 side, due to formation of the above-described one-dimensional photonic band gap structure shown in FIG. 10. In the single-side-heating-type RTP apparatus 100 shown in FIG. 2, most of coming infrared radiation is reflected on the SOI layer 15 side as shown in FIG. 11, so that the temperature detected on the second main surface side of the base wafer 7 can elevate only at a low speed. As a consequence, a control section of the heating lamps 46 tries to increase the power more and more so as to bring the detected temperature to the target value, and results in overshooting as described in the above. Not only radiative heat conduction based on direct incidence of infrared radiation, but also heat conduction from the ambient atmosphere, of course, are contributive to the heat conduction from the surface of the SOI layer 15 to the base wafer 7 side. If the power of the heating lamps 46 is shifted to the excessive side, temperature of the ambient atmosphere not susceptible to the reflection extraordinarily elevates, the temperature of the SOI layer 15 side in contact therewith becomes excessively high, and difference in the temperature between the $t_{OP}$ and back surfaces of the base wafer 7 becomes extremely large.

Figure 8:
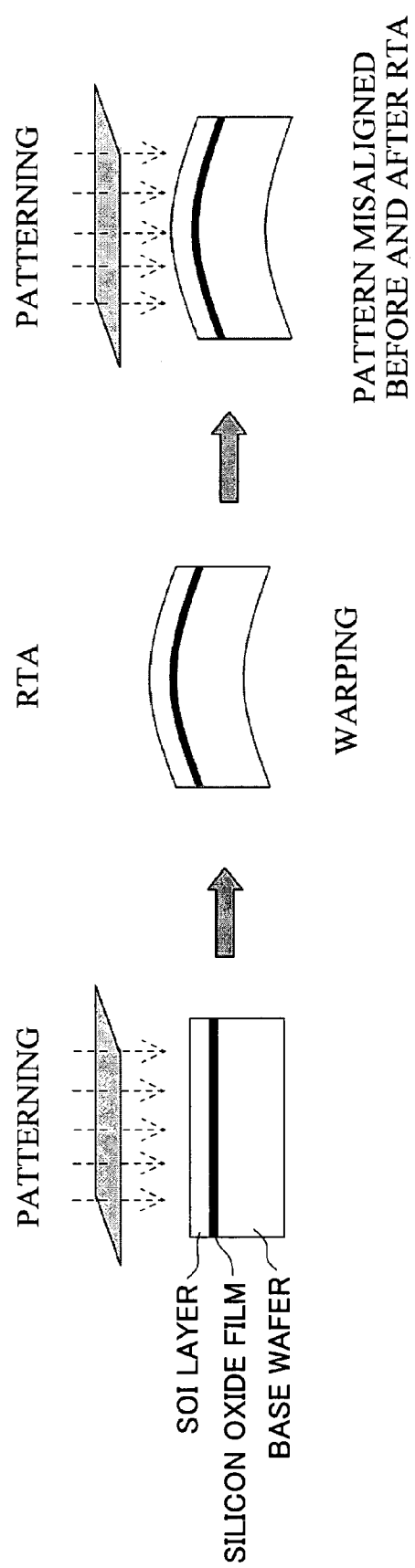
FIG. 8 is a drawing explaining problems arisen from warping of the SOI wafer caused by annealing in device-making processes.

If the base wafer 7 in this situation has a high density of formation of the oxygen precipitates P as shown in FIG. 6, the SOI wafer degraded in the strength due to crystal defects introduced around the oxygen precipitates P shows large in-plane thermal expansion on the SOI layer side exposed to higher temperatures and causes an upwardly-convex strong warping, as shown in FIG. 11. For example, the warping generates when, as shown in FIG. 8, a first-conductivity-type ion implanted region (p-type region when B is implanted, for example) is formed by patterning using photolithographic process, and then activated by rapid thermal annealing. If a second-conductivity-type ion implanted region (n-type region when P is implanted, for example) is formed by patterning while leaving the warping uncorrected, a problem may arise in that a photomask causes misalignment relative to the SOI layer due to in-plane shift ascribable to the warping, and that also the second-conductivity-type ion implanted region to be formed tends to shift.

However, by suppressing the density of formation of the oxygen precipitates P over the entire base wafer 7 to less than $1 \times 10^9/cm^3$ as shown in FIG. 3, the warping of the SOI wafer 50 can fully be suppressed even when the annealing based on the above-described heating system is carried out in the device-making processes, and further misalignment failure of the pattern or the like can be effectively suppressed otherwise as anticipated in FIG. 8.

Figure 7:
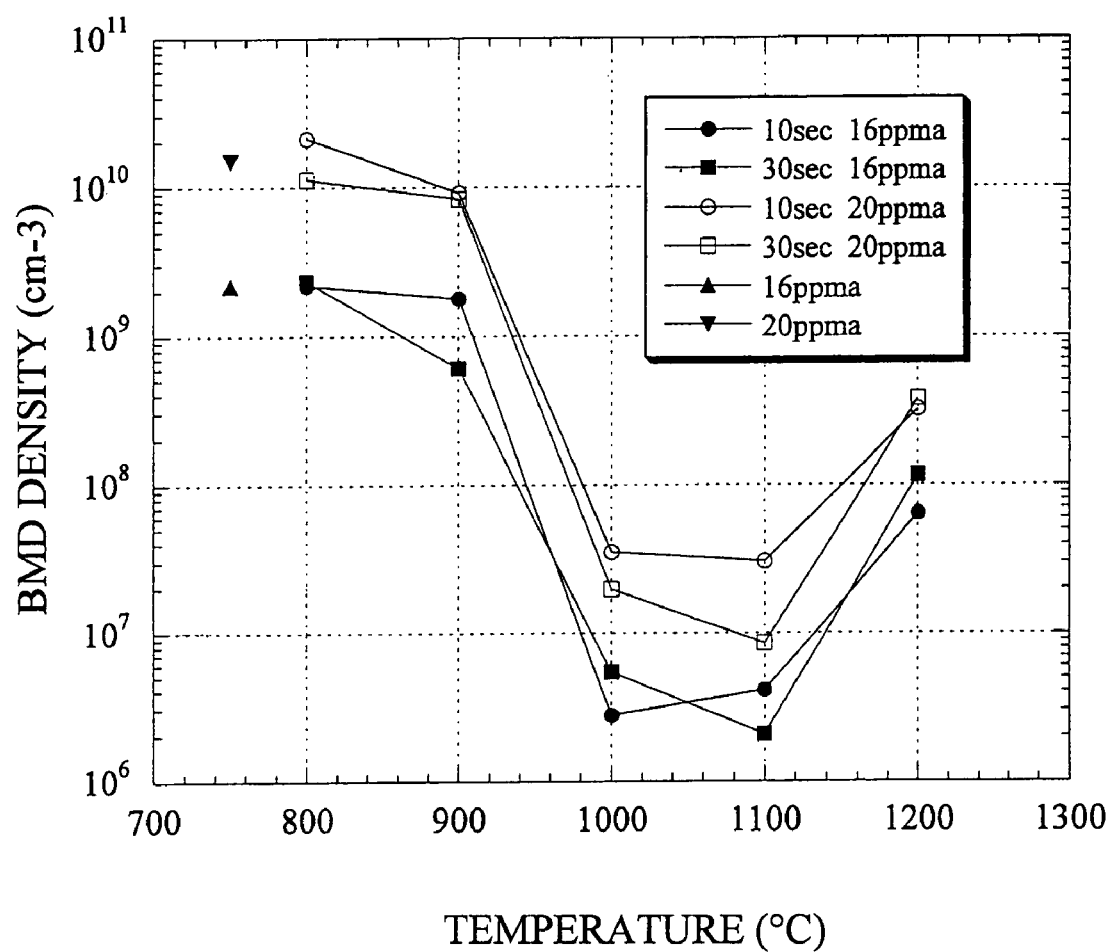
FIG. 7 is a graph showing relations between nuclei killer annealing temperature and density of formation of oxygen precipitate.

Paragraphs below will describe results of experiments conducted in order to confirm the effects of this invention. First, two types of CZ silicon single crystal substrate (200 mm in diameter and 625 μm in thickness) having oxygen concentrations of 16 ppma and 20 ppma, respectively, were prepared as the base wafers. Each of these base wafers was bonded, according to the process steps shown in FIG. 1, with a bond wafer having a silicon oxide film having a thickness t1 of 0.15 μm and having hydrogen ion implanted therein so as to adjust the thickness t2 of the SOI layer to 0.05 μm ((t1×n1)/(t2×n2)=1.29), and then subjected to the delaminating annealing at 500° C. (STEP (f) in FIG. 1). The bonded wafers after the delaminating annealing were subjected to the nuclei killer annealing in the RTP apparatus under a hydrogen atmosphere, at various temperatures for various duration of times, and then subjected to the bonding annealing in a batch-type annealing apparatus as shown in FIG. 6 at 1,100° C. for 120 minutes, to thereby obtain various SOI wafer samples. BMD in the base wafers after the bonding annealing was measured by a publicly-known OPP (optical precipitate profiler), and the density of formation thereof was calculated. Results are shown in FIG. 7. It is obvious that effects of reducing the BMD density appear at a nuclei killer annealing temperature of 900° C. or above, and become most distinct at 1,000° C. to 1,100° C., both ends inclusive.

Of these SOI wafer samples, those gone through the nuclei killer annealing for 30 seconds were put into simulative device-making processes, wherein the samples were heated to 1,100° C. at a temperature elevation speed of 75° C./sec in a single-side-heating-type RTP apparatus (center wavelength of infrared radiation of 1 μm), kept for 60 seconds, and then quitted from the heating. Degrees of warping of the SOI wafer samples after completion of the simulative device-making processes were measured by a commercially-available flatness tester (from ADE Corporation). Results are shown in Table 1.

TABLE 1

| | Temperature (° C.) | | | | |
|---|---|---|---|---|---|
| | 800 | 900 | 1,000 | 1,100 | 1,200 |
| Warping (μm) | ≧200 | ≧200 | ≦50 | ≦50 | ≦70 |

It is known from the results that the samples went through the nuclei killer annealing within the appropriate temperature range were distinctively decreased in the degrees of warping.

Second Mode of Embodiment

The SOI wafers after completion of the bonding annealing and therefore having a large number of BMD formed in the base wafers can be subjected to the precipitate clearing annealing aimed at reducing the density of formation of the BMD. First, prior to the precipitate clearing annealing, an oxide film on the surface of the SOI wafer is removed, and then subjected to a process step for removing a damaged layer and surface roughness of the SOI layer. It is known that fabrication of SOI wafers by the ion implantation delamination method produces a damaged layer and surface roughness, when ion implantation is carried out, remained in the surficial portion of the SOI layer. It is therefore a general practice to remove the damaged layer and surface roughness formed in the SOI layer after completion of the bonding annealing. A method of annealing in an inert gas such as Ar gas, or hydrogen gas, or a mixed gas of the both is adoptable to the removal step. The annealing is proceeded typically in an Ar atmosphere at 1,150 to 1,250° C. for 1 to 5 hours. The removal step of the damaged layer with the aid of annealing is, however, not essential.

Next, the precipitate clearing annealing for reducing the BMD is carried out. More specifically, as shown in the upper drawing of FIG. 14, a plurality of SOI wafers 50b after gone through the removal step of the damaged layer with the aid of annealing are housed in a wafer boat 62, and are introduced into a batch-type annealing furnace 60 together with the wafer boat 62. Temperature in the annealing furnace 60 is controlled by a heater 61 so as to adjust the temperature higher than that in the bonding annealing explained referring to FIG. 6, specifically at 1,275° C. to 1,350° C., both ends inclusive. The annealing under this level of temperature solubilizes the BMD formed in the base wafer 7 of the SOI wafer 50b, and instead increases the dissolved oxygen. Although the annealing time may vary depending on the target hold temperature and the diameter of the wafer to be processed (200 mm, 300 mm, or larger), it is preferably set to 1 hour to 5 hours, both ends inclusive, taking progress of solubilization of the BMD and economic efficiency into consideration. The pressure is set to the normal pressure.

The inner space of the annealing furnace 60 is adjusted so as to contain substantially argon only, and a trace amount of oxygen. Any other rare gas may be used in place of argon. Annealing in an atmosphere containing a trace amount of oxygen is preferable in view of decreasing the BMD, because it can suppress introduction of vacancy into silicon single crystal. Oxygen concentration in the atmosphere is preferably adjusted to 0.3 vol % to 5 vol %, both ends inclusive. In this way, an SOI wafer 500 having only an extremely small density of formation of BMD (P) can be obtained, as shown in the lower drawing in FIG. 14.

Thus-obtained SOI wafer 500 can further be improved in the surface roughness of the SOI layer 15 by touch polishing. The touch polishing refers to a mirror polishing causing only an extremely small polishing stock removal, and is generally carried out by chemical-mechanical polishing. Removal of the damaged layer and improvement in the surface roughness are attainable also by carrying out the touch polishing, in place of, or after the removal process of the damaged layer with the aid of annealing explained in the above.

It is to be noted that improvement in the surface roughness alters the thickness of the SOI layer 15, so that the thickness t1 of the silicon oxide film 2 and thickness t2 of the SOI layer 15 are more preferably selected so as to satisfy, when all of these processes are completed, a relation of $0.1\lambda < t_{OP} < 2\lambda$, and so as to make $(t1 \times n1)/(t2 \times n2)$ fall within the range from 0.2 to 3, both ends inclusive, assuming refractive index n1 of $SiO_2$ composing the silicon oxide film 2 in the infrared wavelength region as 1.5, refractive index n2 of Si composing the SOI layer 15 as 3.5, and optical thickness $t_{OP}$ of the silicon oxide film 2 and the SOI layer 15 in the infrared wavelength region as $t_{OP} = n1 \times t1 + n2 \times t2$ as described in the above.

Figure 15:
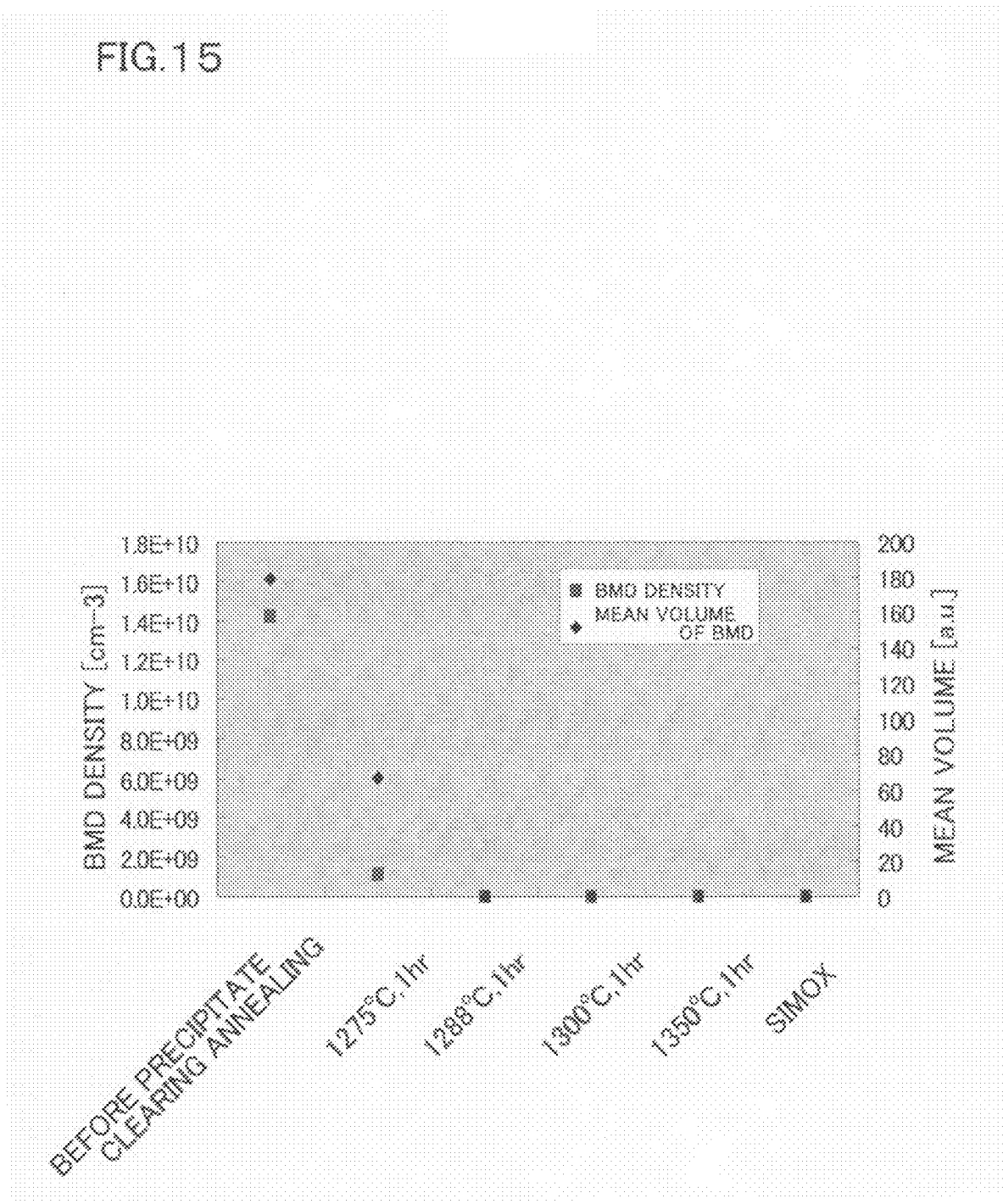
FIG. 15 is a graph showing results of measurement of BMD density in the base wafer.

FIG. 15 is a graph showing results of measurement of BMD density, measured by the publicly-known LST (light scattering tomography) method, in the base wafers of the SOI wafers gone through the precipitate clearing annealing under several conditions. All samples were manufactured using the CZ wafers (200 mm in diameter) having the initial oxygen concentration adjusted to 13.8 ppma to 14.4 ppma, both ends inclusive, in the same lot up to the removal step of the damaged layer with the aid of the annealing, so that it is assumed that there may be only extremely small influences ascribable to inter-lot errors or difference in the initial oxygen concentration.

The leftmost data represent results of measurement of the SOI wafer 50b having never gone through the precipitate clearing annealing, indicating a high value of BMD density. In contrast to this, the SOI wafer 500 having gone through the precipitate clearing annealing at 1,275° C. for 1 hour showed a BMD density of as low as a level below $1.0 \times 10^9/cm^3$. The SOI wafers 500 having gone through the precipitate clearing annealing at 1,288° C. for 1 hour, at 1,300° C. for 1 hour, and at 1,350° C. for 4 hour showed BMD densities of as low as levels below the detection limit of the LST apparatus (approximately $1.0 \times 10^6/cm^3$). The rightmost data represents the BMD density in an SIMOX wafer measured for reference, proving that this invention is successful in lowering the BMD density to a level almost comparable to that in the SIMOX wafer.

Lowering in the BMD density by the precipitate clearing annealing is obvious also from the results of measurement of the dissolved oxygen concentration. FIG. 16 is a graph showing results of measurement of the dissolved oxygen concentration in the base wafers 7 measured by the FT-IR method, for the samples same as those shown in FIG. 15. The measurement of dissolved oxygen concentration was made on three points, including the center of wafer, a point R/2 (R: radius) away from the center of wafer, and a point 10 mm away from the outer periphery of wafer, only to find little difference.

The data indicating the lowest dissolved oxygen concentration corresponds to the SOI wafer 50b having never gone through the precipitate clearing annealing, given as approximately 8 ppma. Because the CZ wafer having an initial oxygen concentration of 13.8 ppma to 14.4 ppma, both ends inclusive, was used as described previously, the differential is supposed to precipitate as the BMD. In contrast to this, the SOI wafers 500 obtained after the precipitation clearing annealing show values ranging from approximately 13 ppma to approximately 16 ppma. Among these, the SOI wafer 500 obtained after the precipitation clearing annealing at 1,350° C. for 4 hours showed a dissolved oxygen concentration exceeding the initial value. This finding indicates that oxygen contained in the atmosphere of the precipitate clearing annealing was incorporated into the base wafer 7. Higher inter-lattice oxygen concentration is advantageous in enhancing an effect of suppressing migration of dislocation produced by thermal stress. Also this finding supports that the precipitate clearing annealing is preferably carried out in an atmosphere containing argon and a trace amount of oxygen.

Now, the SOI wafer 500 reduced in the BMD density as described in the above is then subjected to various annealing in the process of device making. For an exemplary case where the doped region is formed by patterning using ion implantation, the dopant just after implanted is not activated as a carrier source, so that annealing is carried out in order to activate the dopant. For an exemplary case of B doping, temperature of the activation annealing is adjusted to 1,100° C. to 1,200° C., both ends inclusive. The annealing is carried out using the RTP apparatus 100 explained referring to FIG. 2. Because the SOI wafer 500 has the density of formation of the oxygen precipitates P suppressed to less than $1 \times 10^9/cm^3$ over the entire base wafer 7, the warping can fully be suppressed even when the annealing in the device-making process was carried out adopting the single-side-heating system, and further misalignment failure of the pattern or the like can be effectively suppressed, otherwise as anticipated in FIG. 8.

The above description of this patent specification has dealt the nuclei killer annealing and the precipitate clearing annealing as those executable in an independent manner, whereas the nuclei killer annealing, the bonding annealing and the precipitate clearing annealing may be executed in this order.

What is claimed is:

1. A method of manufacturing an SOI wafer configured as having a base wafer composed of silicon single crystal, and an SOI layer composed of a semiconductor single crystal, bonded on a first main surface of the base wafer while placing a silicon oxide film in between, the SOI wafer destined for an annealing step by infrared irradiation with a peak wavelength $\lambda$ of 0.7 $\mu m \leq \lambda \leq 2\mu m$ on a top surface of the SOI layer, the method comprising:
a delamination-use ion implanted layer forming step of forming a delamination-use ion implanted layer by implanting ions through an ion implantation surface on a first main surface side of a bond wafer,
a bonding step of bonding the first main surface of the base wafer composed of a silicon single crystal and the first main surface of the bond wafer composed of a semiconductor single crystal, while placing the silicon oxide film, which is formed on at least one of these main surfaces, in between the first main surface of the base wafer and the first main surface of the bond wafer;
a delamination step, following the bonding step, of delaminating a semiconductor single crystal thin layer, destined for the SOI layer, from the bond wafer at the delamination-use ion implanted layer,
a nuclei killer annealing step for clearing precipitation nuclei of an oxygen precipitate or reducing a density of formation of the precipitation nuclei in the entire base wafer; and
after the nuclei killer annealing step, a bonding annealing step in a batch-type annealing furnace of enhancing bonding of the SOI layer to the base wafer while leaving the silicon oxide film in between the SOI layer and the base wafer,
wherein, a refractive index of $SiO_2$ composing the silicon oxide film in an infrared wavelength region of n1, a refractive index of a semiconductor composing the SOI layer of n2, and an optical thickness $t_{OP}$ of the silicon oxide film and the SOI layer in the infrared wavelength region where $t_{OP}=n1 \times t1+n2 \times t2$, a thickness t1 of the silicon oxide film and a thickness t2 of the SOI layer after the bonding are set so as to satisfy a relation of $0.1\lambda < t_{OP} < 2\lambda$, and so as to make $(t1 \times n1)/(t2 \times n2)$ fall within a range from $0.2 < (t1 \times n1)/(t2 \times n2) \leq 3$,
density of formation of oxygen precipitate in the entire base wafer after the bonding annealing is adjusted to less than $1 \times 10^9/cm^3$, and
the nuclei killer annealing is carried out while setting an annealing hold temperature, t, at 900° C.$\leq$t$\leq$1,200° C., with a temperature elevation, $t_e$, speed up to the annealing hold temperature of 5° C./second$\leq t_e \leq$100° C./second.

2. The method of manufacturing an SOI wafer claimed in claim 1, wherein the SOI layer is composed of silicon single crystal.

3. The method of manufacturing an SOI wafer claimed in claim 1, wherein the base wafer is obtained by the Czochralski method using a quartz crucible.

4. The method of manufacturing an SOI wafer claimed in claim 1, wherein the nuclei killer annealing is carried out using a single-wafer-processing-type rapid annealing apparatus based on infrared radiation lamp heating.

5. The method of manufacturing an SOI wafer claimed in claim 1, wherein the nuclei killer annealing is carried out in a hydrogen atmosphere, an Ar atmosphere, or a mixed atmosphere of hydrogen and Ar, while setting the annealing hold temperature, t, at 900° C.$\leq$t$\leq$1,100° C.

6. The method of manufacturing an SOI wafer claimed in claim 1, wherein the nuclei killer annealing is carried out in an oxygen-containing atmosphere, while setting the annealing hold temperature, t, at 900° C.$\leq$t$\leq$1,200° C.

7. The method of manufacturing an SOI wafer claimed in claim 4, wherein the nuclei killer annealing is carried out after the delamination step.

8. The method of manufacturing an SOI wafer claimed in claim 5, wherein the nuclei killer annealing is carried out after the delamination step.

9. The method of manufacturing an SOI wafer claimed in claim 6, wherein the nuclei killer annealing is carried out after the delamination step.

10. The method of manufacturing an SOI wafer claimed in claim 1, wherein the nuclei killer annealing is carried out while setting annealing hold temperature, t, at 1,000° C.$\leq$t$\leq$1,100° C.

11. A method of manufacturing an SOI wafer configured as having a base wafer composed of silicon single crystal, and an SOI layer composed of a semiconductor single crystal, bonded on a first main surface of the base wafer while placing a silicon oxide film in between, the SOI wafer destined for an annealing step by infrared irradiation with a peak wavelength $\lambda$ of 0.7 $\mu m \leq \lambda \leq 2$ $\mu m$, on a top surface of the SOI layer, the method comprising:
a bonding step of bonding the first main surface of the base wafer composed of a silicon single crystal and a first main surface of a bond wafer composed of a semiconductor single crystal, while placing the silicon oxide film, which is formed on at least one of these main surfaces, in between the first main surface of the base wafer and the first main surface of the bond wafer;
a thinning step of thinning the bond wafer so as to leave it as the SOI layer;
a bonding annealing step of enhancing bonding of the SOI layer to the base wafer while placing the silicon oxide film in between the SOI layer and the base wafer; and
after the bonding annealing step, adjusting the density of oxygen precipitate formed in the entire base wafer to less than $1 \times 10^9/cm^3$ by carrying out precipitation clearing annealing under conditions of a hold temperature, t, of 1,275° C.$\leq$t$\leq$1,350° C., and a hold time $t_h$ of 1 hour$\leq t_h \leq$5 hours, to reduce the density of oxygen precipitate formed in the entire base wafer,
wherein, a refractive index of $SiO_2$ composing the silicon oxide film in the infrared wavelength region of n1, a refractive index of a semiconductor composing the SOI layer of n2, and an optical thickness $t_{OP}$ of the silicon oxide film and the SOI layer in the infrared wavelength region as $t_{OP}=n1 \times t1+n2 \times t2$, the thickness t1 of the silicon oxide film and thickness t2 of the SOI layer after the bonding are set so as to satisfy a relation of $0.1\lambda < t_{OP} < 2\lambda$, and so as to make $(t1 \times n1)/(t2 \times n2)$ fall within the range from $0.2 \leq (t1 \times n1)/(t2 \times n2) \leq 3$.

12. The method of manufacturing an SOI wafer claimed in claim 11, wherein the SOI layer is composed of silicon single crystal.

13. The method of manufacturing an SOI wafer claimed in claim 11, wherein the base wafer is obtained by the Czochralski method using a quartz crucible.

14. The method of manufacturing an SOI wafer claimed in claim 11, wherein the precipitation clearing annealing is carried out in an atmosphere containing an inert gas and a trace amount of oxygen.

15. The method of manufacturing an SOI wafer claimed in claim 11, wherein the thinning step further comprises a delamination-use ion implanted layer forming step of forming a delamination-use ion implanted layer by implanting ions through an ion implantation surface on a first main surface side of the bond wafer, prior to the bonding step; and a delamination step, following the bonding step, of delaminating a semiconductor single crystal thin layer destined for the SOI layer from the bond wafer at the delamination-use ion implanted layer.

* * * * *